United States Patent
Boenigk

(10) Patent No.: US 12,399,258 B2
(45) Date of Patent: Aug. 26, 2025

(54) LIGHT EMITTING DEVICE

(71) Applicant: OSRAM GmbH, Munich (DE)

(72) Inventor: Michael Boenigk, Berlin (DE)

(73) Assignee: OSRAM GmbH, Munich (DE)

( * ) Notice: Subject to any disclaimer, the term of this patent is extended or adjusted under 35 U.S.C. 154(b) by 123 days.

(21) Appl. No.: 18/252,994

(22) PCT Filed: Oct. 5, 2021

(86) PCT No.: PCT/EP2021/077341
§ 371 (c)(1),
(2) Date: May 15, 2023

(87) PCT Pub. No.: WO2022/100929
PCT Pub. Date: May 19, 2022

(65) Prior Publication Data
US 2023/0417881 A1 Dec. 28, 2023

(30) Foreign Application Priority Data
Nov. 16, 2020 (DE) .......................... 102020130181.2

(51) Int. Cl.
H05B 45/30 (2020.01)
G01S 7/484 (2006.01)
(Continued)

(52) U.S. Cl.
CPC .............. *G01S 7/484* (2013.01); *G01S 17/10* (2013.01); *H01S 5/0428* (2013.01)

(58) Field of Classification Search
CPC ........ H05B 45/10; H05B 45/30; H05B 45/31; H05B 45/34; H05B 45/345; H05B 47/10; G01S 7/10; G01S 7/484; H01S 5/0428
See application file for complete search history.

(56) References Cited

U.S. PATENT DOCUMENTS

| 4,349,816 A | 9/1982 | Miller et al. |
| 9,368,936 B1 | 6/2016 | Lenius et al. |

(Continued)

FOREIGN PATENT DOCUMENTS

| CN | 1961480 A | 5/2007 |
| CN | 105932997 A | 9/2016 |

(Continued)

*Primary Examiner* — Long Nguyen
(74) *Attorney, Agent, or Firm* — Slater Matsil, LLP

(57) ABSTRACT

In an embodiment a light emitting device includes a light source, a switching element having an input capacitance associated therewith, the switching element being configured to control a current flow to the light source in accordance with a charging of the input capacitance, a voltage control element coupled with the switching element and having a voltage supply node, the voltage control element having a second capacitance associated therewith, wherein the voltage control element and an input of the switching element are coupled to one another such that the voltage control element and the input of the switching element form a capacitive voltage divider and a driving element configured to provide a driving voltage at the voltage supply node, the driving voltage being greater than a maximum allowable input voltage of the switching element, wherein a relationship between the input capacitance and the second capacitance is in accordance with a relationship between the driving voltage and the maximum allowable input voltage.

15 Claims, 14 Drawing Sheets

(51) Int. Cl.
 *G01S 17/10* (2020.01)
 *H01S 5/042* (2006.01)

(56) References Cited

U.S. PATENT DOCUMENTS

| | | |
|---|---|---|
| 9,648,685 B2 | 5/2017 | Toivola |
| 9,774,320 B2 | 9/2017 | Rossberg et al. |
| 10,224,923 B2 | 3/2019 | Sicard et al. |
| 2006/0022918 A1* | 2/2006 | Tang ............... H05B 45/40 345/84 |
| 2007/0146020 A1* | 6/2007 | Williams ........... H02M 3/158 327/110 |
| 2007/0177323 A1 | 8/2007 | Sneep |
| 2015/0168484 A1 | 6/2015 | Rátz |

FOREIGN PATENT DOCUMENTS

| | | |
|---|---|---|
| DE | 102005022715 A1 | 11/2006 |
| WO | 2011073498 A1 | 6/2011 |
| WO | 2014068352 A1 | 5/2014 |

* cited by examiner

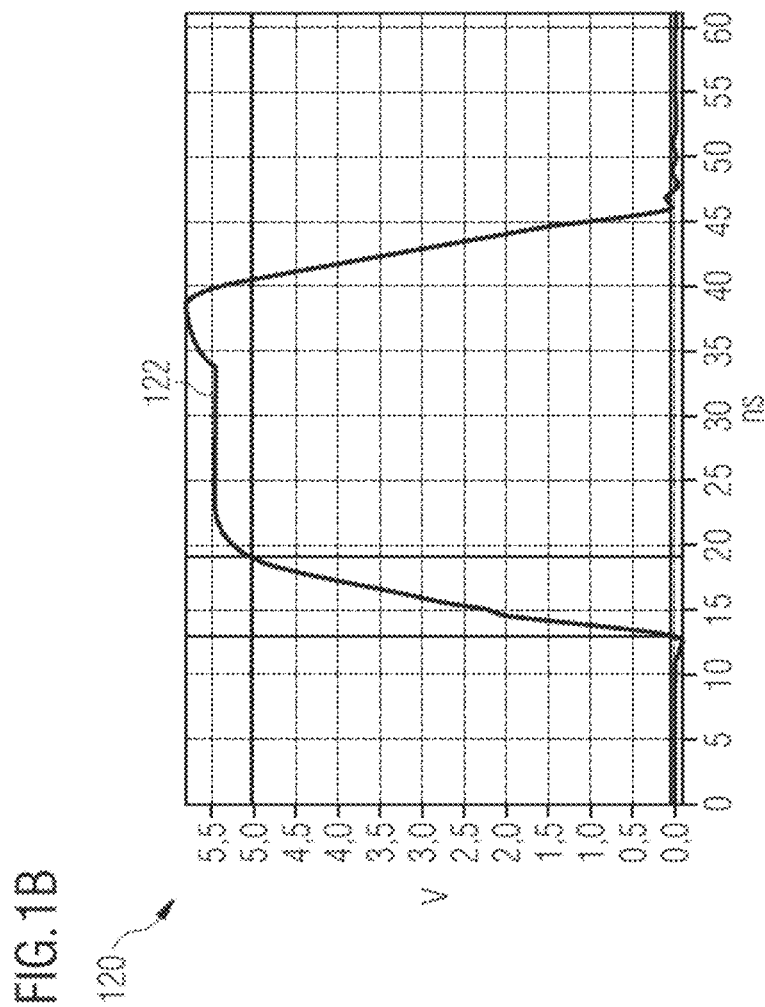

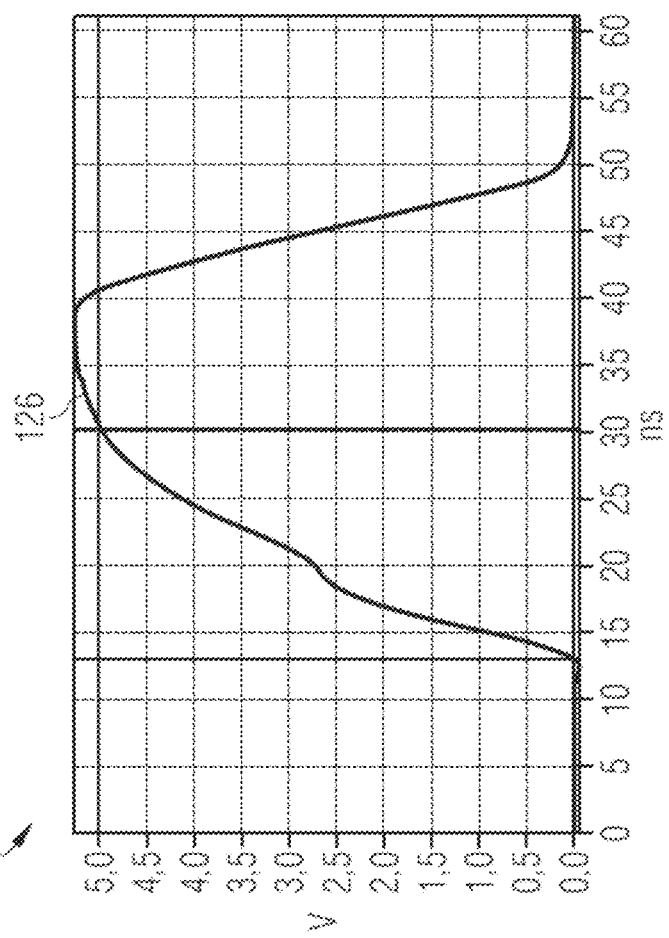

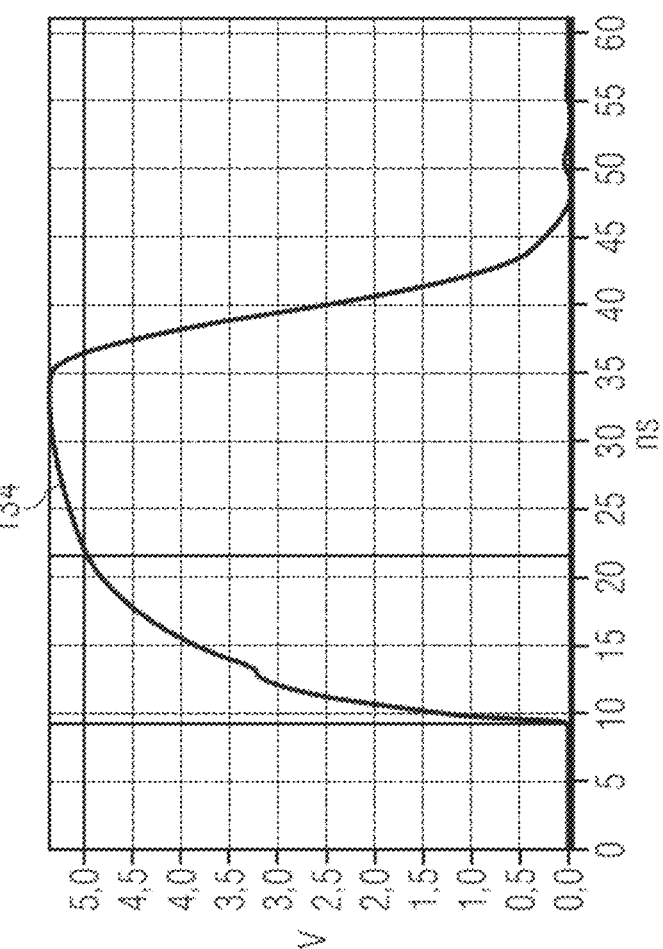

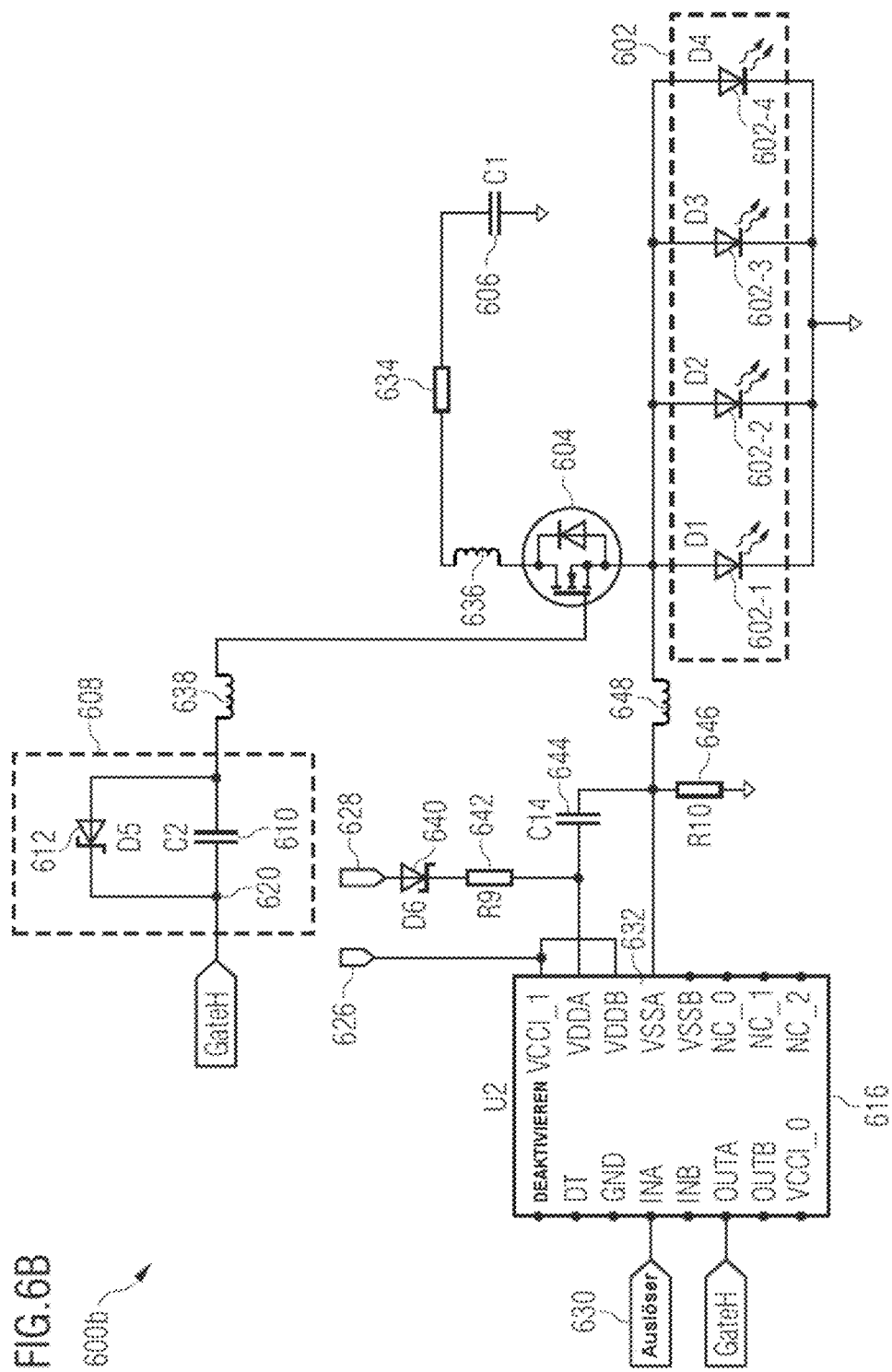

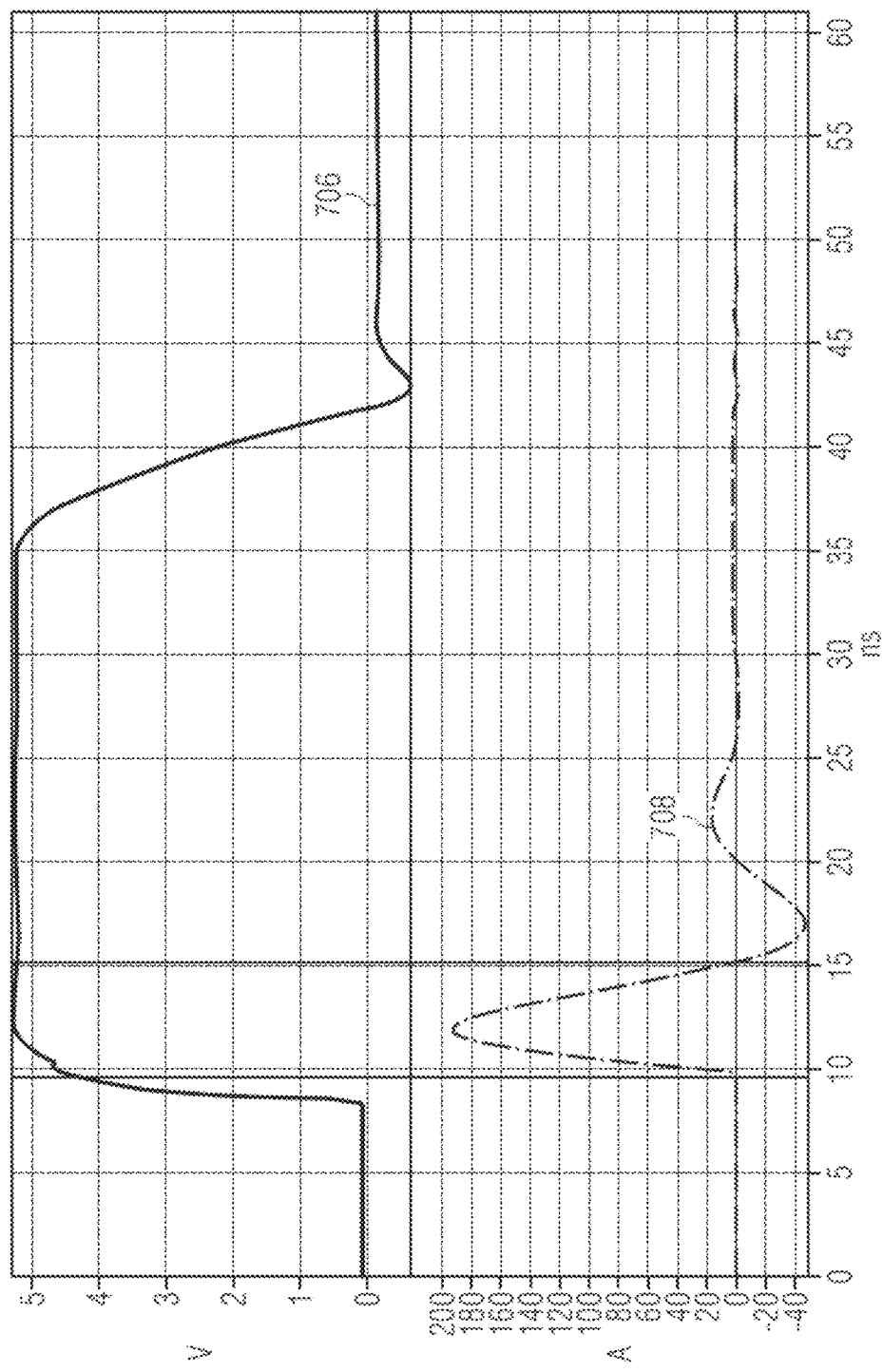

LIGHT EMITTING DEVICE

CROSS-REFERENCE TO RELATED APPLICATIONS

This patent application is a national phase filing under section 371 of PCT/EP2021/077341, filed Oct. 5, 2021, which claims the priority of German patent application 102020130181.2, filed Nov. 16, 2020, each of which is incorporated herein by reference in its entirety.

TECHNICAL FIELD

Various embodiments are related to a light emitting device, and various embodiments are related to a LIDAR ("Light Detection and Ranging") system including a light emitting device.

BACKGROUND

Light detection and ranging is a sensing technique that is used, for example, in the field of autonomous driving for providing detailed information about the surrounding of an automated or partially automated vehicle. LIDAR light is used to scan a scene and determine the properties (e.g., the location, the speed, the direction of motion, and the like) of the objects present therein. In a LIDAR system, the scanning of the scene may be carried out with narrow light pulses having steep rising edges, for example with narrow laser pulses (e.g., with sine-like half-wave laser pulses having a pulse width of about 10 ns).

SUMMARY

Various embodiments are related to a simple and cost-efficient configuration of a light emitting device for the generation of narrow light pulses. Various embodiments are related to a driving arrangement that enables fast driving of a light source without having to rely on sophisticated and/or expensive driver circuits. The driving arrangement may include a switching element that controls a current flow to the light source by switching between a conducting state and a non-conducting state depending on the charging of an input capacitance of the switching element. The driving arrangement may be adapted to provide fast charging of the input capacitance, to enable fast control over the current flow, e.g. fast delivery of a current pulse to the light source. In some embodiments, the driving arrangement may be adapted such that the switching element may receive a high current (illustratively, a high amount of charge) for charging the input capacitance, without damaging the switching element. In some embodiments, the driving arrangement may be adapted to operate with a driving voltage greater than a maximum allowable input voltage of the switching element. The driving arrangement may be configured such that the (high) driving voltage provides fast charging of the input capacitance of the switching element (illustratively, fast switching of the current flow), without damaging or causing a malfunction of the switching element. Illustratively, the driving arrangement may enable providing narrow current pulses to the light source for emitting narrow light pulses. In some embodiments, the driving arrangement may be configured to enable a rapid discharge of a charge storage element for driving the light source.

In various embodiments, a light emitting device may include: a light source; a switching element having an input capacitance associated therewith, the switching element being configured to control a current flow to the light source in accordance with a charging of the input capacitance; a voltage control element coupled with the switching element and with a voltage supply node, the voltage control element having a second capacitance associated therewith, wherein the voltage control element and an input of the switching element are coupled to one another in such a way that the voltage control element and the input of the switching element form a capacitive voltage divider; and a driving element configured to provide a driving voltage at the voltage supply node, the driving voltage being greater than a maximum allowable input voltage of the switching element, and wherein a relationship between the input capacitance and the second capacitance is in accordance with a relationship between the driving voltage and the maximum allowable input voltage.

In various embodiments, a light emitting device may include: a light source; a switching element including an input node, the switching element being configured to control a current flow to the light source in accordance with an input voltage provided at the input node; a voltage control element coupled with a voltage supply node and with the input node; and a driving element configured to provide a driving voltage at the voltage supply node, the driving voltage being greater than a maximum allowable input voltage of the switching element, wherein the voltage control element and the input node are coupled to one another in such a way that a first portion of the driving voltage is provided at the input node as input voltage and a second portion of the driving voltage drops across the voltage control element, wherein a relationship between the first portion and the second portion is in accordance with a relationship between the driving voltage and the maximum allowable input voltage.

In various embodiments, a light emitting device may include: a light source; a semiconductor transistor having a gate capacitance associated therewith, the semiconductor transistor being configured to control a current flow to the light source in accordance with a charging of the gate capacitance; a passive network coupled with the semiconductor transistor and with a voltage supply node, wherein the passive network and the semiconductor transistor are coupled to one another to form a capacitive voltage divider, wherein the passive network includes a capacitor having a second capacitance; and a high-side driver configured to provide a driving voltage at the voltage supply node, the driving voltage being greater than a maximum allowable gate-source voltage of the semiconductor transistor, and wherein a relationship between the gate capacitance and the second capacitance is in accordance with a relationship between the driving voltage and the maximum allowable gate-source voltage.

In various embodiments, a driving arrangement for driving a light source may include: a switching element including a second control node, a third control node, and a first control node to control an electrical behavior of the second control node and the third control node; a voltage control element coupled with a voltage supply node and with the switching element at the first control node, wherein the voltage control element and the switching element are coupled to one another in such a way that the voltage control element and the switching element form a capacitive voltage divider; and a driving element configured to provide a driving voltage at the voltage supply node, the driving voltage being greater than a maximum allowable input voltage of the switching element, and wherein a relationship between a capacitance associated with the voltage control element and a capacitance associated with the switching element is in accordance with a relationship between the driving voltage and the maximum allowable input voltage.

Various embodiments may be related to a LIDAR system including the light emitting device described herein. The emission of narrow light pulses enabled by the light emitting device may allow increasing the detection range of the LIDAR system. The LIDAR system may be part, for example, of a vehicle or of a smart farming or of an indoor monitoring system.

BRIEF DESCRIPTION OF THE DRAWINGS

In the drawings, like reference characters generally refer to the same parts throughout the different views. The drawings are not necessarily to scale, emphasis instead generally being placed upon illustrating the principles disclosed herein. In the following description, various embodiments disclosed herein are described with reference to the following drawings, in which:

FIG. 1B shows schematically a driving pulse for a semiconductor transistor according to various embodiments;

FIG. 1D shows schematically a driving pulse for a semiconductor transistor according to various embodiments;

FIG. 1F and FIG. 1G each shows schematically a driving pulse for a semiconductor transistor according to various embodiments;

FIG. 6A and FIG. 6B each shows schematically a light emitting device according to various embodiments; and FIG. 7A and FIG. 7B each shows schematically a driving pulse for a semiconductor transistor according to various embodiments.

DETAILED DESCRIPTION OF ILLUSTRATIVE EMBODIMENTS

The following detailed description refers to the accompanying drawings that show, by way of illustration, specific details and embodiments disclosed herein may be practiced. These embodiments are described in sufficient detail to enable those skilled in the art to practice the disclosed implementations. Other embodiments may be utilized and structural, logical, and electrical changes may be made without departing from the scope of the disclosed implementations. The various embodiments are not necessarily mutually exclusive, as some embodiments may be combined with one or more other embodiments to form new embodiments. Various embodiments are described in connection with methods and various embodiments are described in connection with devices (e.g., a light emitting device, or a switching arrangement). However, it is understood that embodiments described in connection with methods may similarly apply to the devices, and vice versa.

The term "coupled" may be used herein with respect to nodes, terminals, integrated circuit elements, and the like, to mean electrically coupled, which may include a direct coupling or an indirect coupling, wherein an indirect coupling may only include additional structures in the current path that do not influence the substantial functioning of the described circuit or device.

In a LIDAR system, laser pulses may be generated by driving a corresponding pulsed current (e.g., a sine-like half-wave current pulse with a peak amplitude of 160 A) through one or more laser diodes. However, the generation of narrow laser pulses presents various challenges, as described in further detail below in relation to FIG. 1A to FIG. 1G.

Figure 1A:
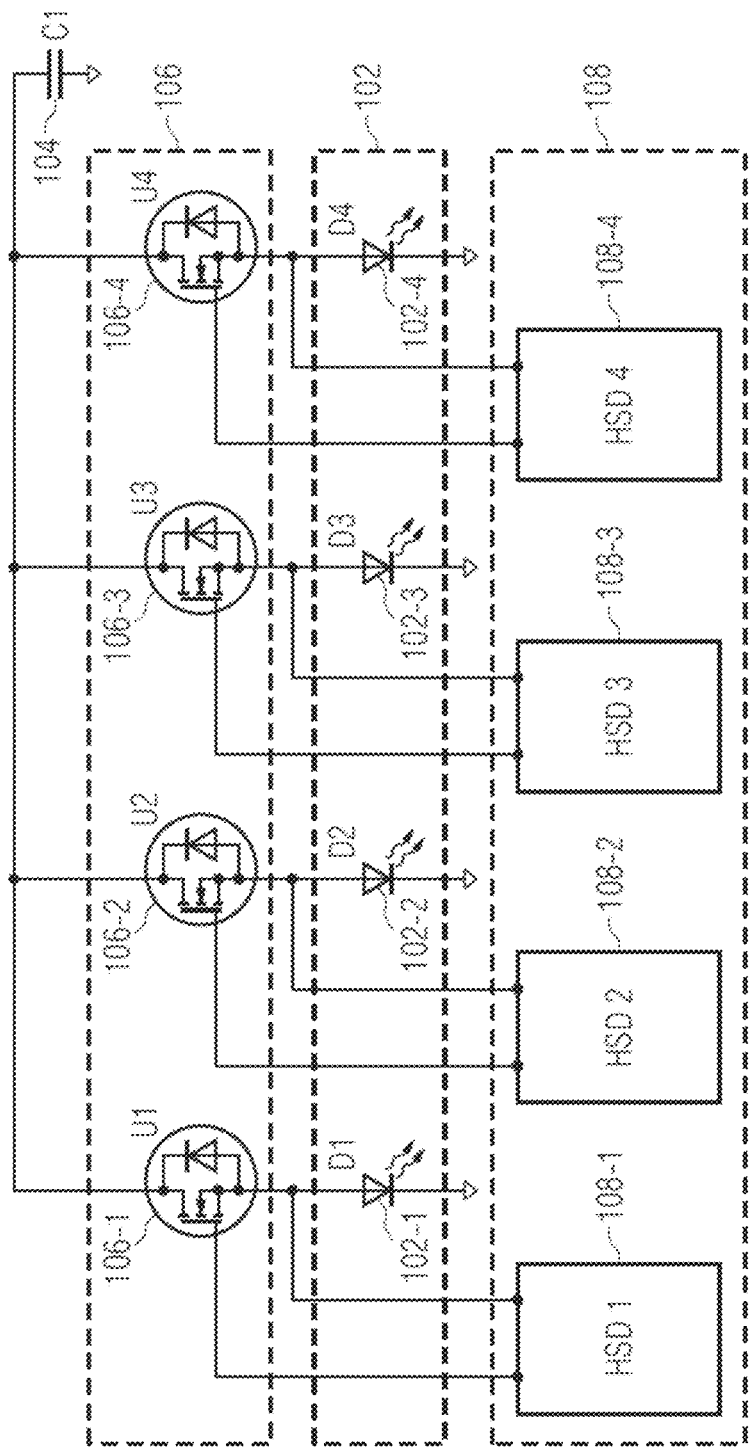
FIG. 1A shows schematically a light emitting device according to various embodiments.
Figure 1C:
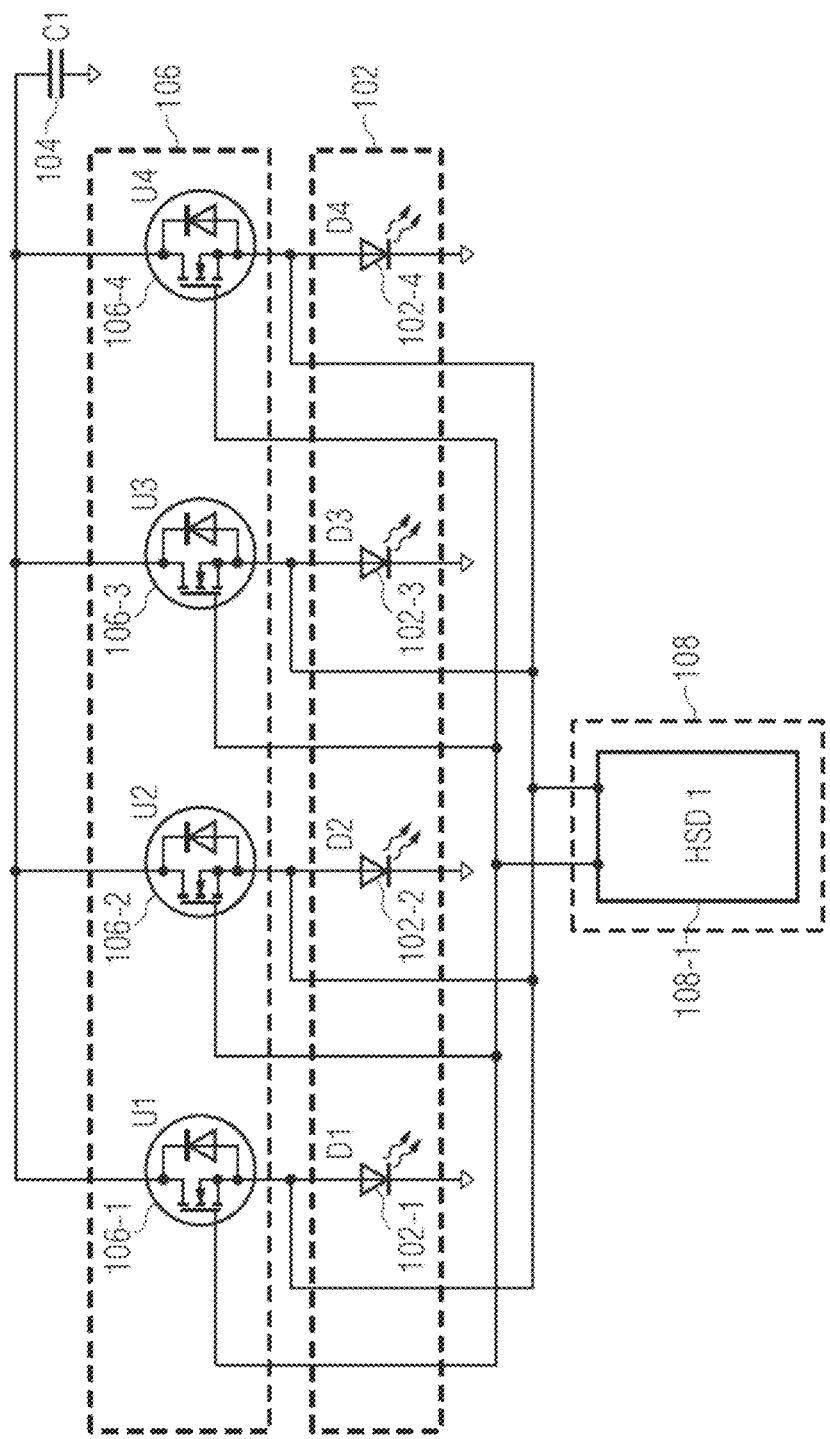
FIG. 1C shows schematically a light emitting device according to various embodiments.
Figure 1E:
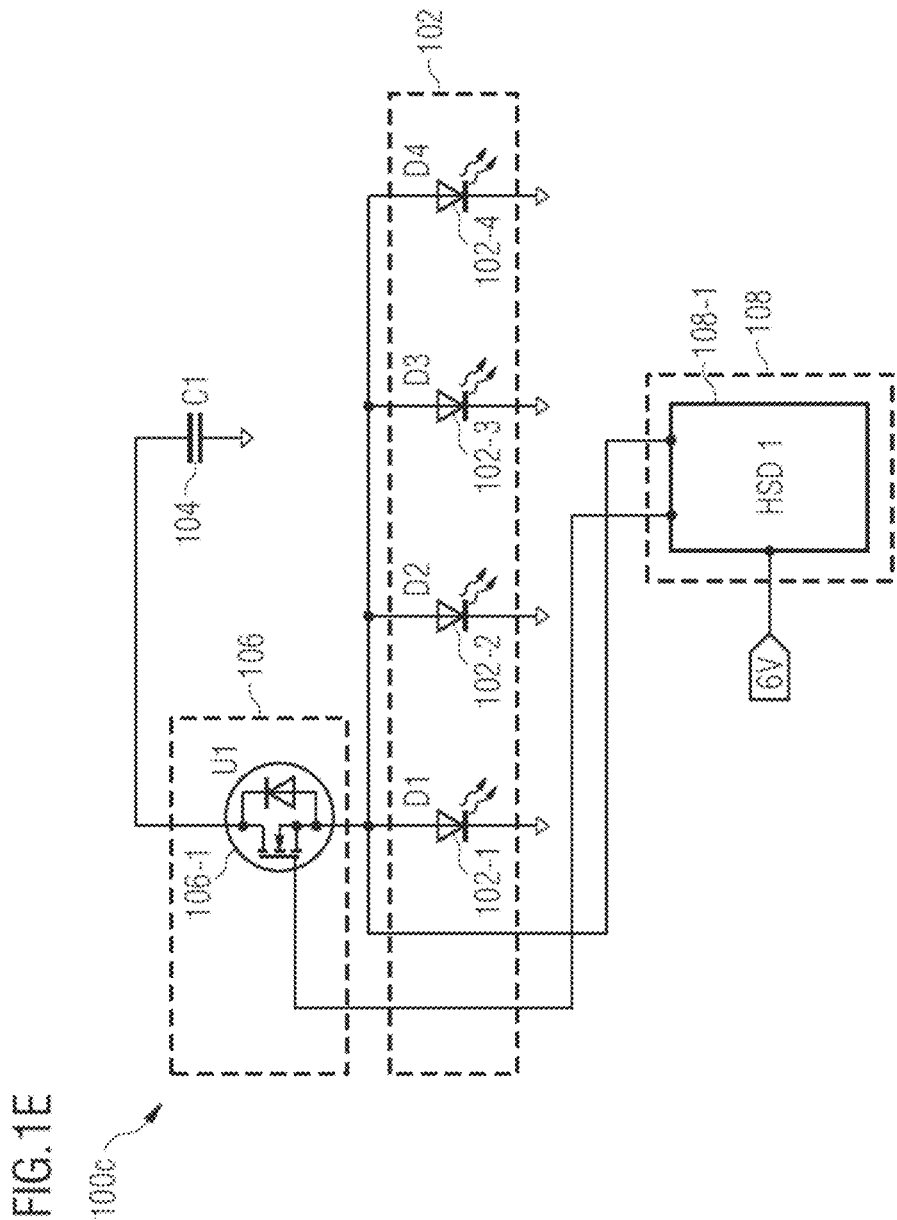
FIG. 1E shows schematically a light emitting device according to various embodiments.

FIG. 1A, FIG. 1C, and FIG. 1E each schematically shows a respective light emitting device 100a, 100b, 100c for use in a LIDAR system. Each light emitting device 100a, 100b, 100c may include one or more laser diodes 102, e.g. four laser diodes 102-1 (D1), 102-2 (D2), 102-3 (D3), 102-4 (D4) in the exemplary configurations shown in FIG. 1A, FIG. 1C and FIG. 1E. The laser diodes 102 may be configured to emit laser pulses upon receiving a current (only as a numerical example, a current of 40 A for each laser diode 102) provided by the discharging of a capacitor 104 (C1). The discharging of the capacitor 104 may provide, as an example, a sine-like half-wave current pulse. A laser pulse generated by a laser diode 102 may be proportional to the pulsed current. The minimum width as well as the maximum pulse height are defined by the properties of the laser diodes 102, of the capacitor 104, as well as by the limiting properties (e.g., the impedance) of the circuit layout. As a numerical example, a laser pulse emitted by a laser diode 102 may have a pulse width of 10 ns.

The current flow to the one or more laser diodes 102 provided by the discharging of the capacitor 104 may be controlled by means of one or more semiconductor switches 106, e.g. one or more semiconductor transistors 106. A semiconductor transistor may be capable of withstanding the high current intensity of the current pulses provided to the laser diodes 102. By way of example, the one or more semiconductor transistors 106 may include one or more voltage-controlled semiconductor transistors such as one or more metal-oxide semiconductor field-effect transistors (MOS-FET) or one or more gallium nitride field-effect transistors (GaN-FET). Due to the high current to be switched and due to the associated large semiconductor area, a semiconductor transistor may have a high input capacitance (e.g., a high gate capacitance). In some scenarios, a plurality of semiconductor transistors may be coupled in parallel with one another, which results in an even greater input capacitance. A pulse (e.g., a voltage pulse) controlling a semiconductor transistor may provide a charging of the input capacitance to control the current flow to the laser diodes 102.

The one or more semiconductor transistors 106 may be controlled by means of one or more driver circuits 108, e.g. one or more high-side drivers 108. A driver circuit may be provided with a corresponding current load for controlling the associated semiconductor transistor(s), e.g. for controlling the gate of the associated semiconductor transistor(s). A fast charging of the gate capacitance may be provided by a high current. After the gate capacitance has been charged, the current flow in the laser diode is provided by maintaining the corresponding voltage at the gate of the semiconductor transistor(s).

The detection range of a LIDAR system may be dependent on the maximum height of the laser pulses emitted by the laser diodes 102. Since the maximum energy of a laser pulse may be limited by standard requirements related to eye safety, in case the range of the LIDAR system is to be increased narrower laser pulses having a greater amplitude are to be provided. In view of this, the demands on the driver circuits 108 for generating a fast-rising short current pulse are currently subject to constantly increasing requirements. Illustratively, the rise of the control voltage for a semiconductor switch (e.g., the increase of the gate voltage for a MOS-FET or a GaN-FET) should be significantly steeper than the current pulse to be controlled, otherwise the current rise of the pulse to be controlled is limited and the maximum possible performance of the circuit cannot be achieved.

Various configurations for a light emitting device 100a, 100b, 100c may be possible, as described in further detail below.

As shown, for example, in FIG. 1A, a light emitting device 100a may include a respective semiconductor transistor 106 (e.g., a respective GaN-FET) for each laser diode 102, and a respective high-side driver 108 for each semiconductor transistor 106. In the exemplary configuration shown in FIG. 1A, the light emitting device 100a may include first to fourth semiconductor transistors 106-1, 106-2, 106-3, 106-4 (U1, U2, U3, U4), each associated with a respective one of first to fourth high-side drivers 108-1, 108-2, 108-3, 108-4 (HSD1, HSD2, HSD3, HSD4).

The configuration in FIG. 1A allows dividing the current provided to the laser diodes 102 across the (four) semiconductor transistors 106, which may have a reduced input capacitance. Each high-side driver 108 may see the relatively low input capacitance of the respective semiconductor transistor 106, and faster charging of the input capacitances may be provided. However, there may be a jitter (e.g., in the range from 10 ns to 20 ns) among the high-side drivers 108, and thus a non-uniform switching of the semiconductor transistors 106. The laser pulses emitted by the laser diodes 102 may thus be not superimposed, leading to a broader total pulse with limited height. Furthermore, the configuration shown in FIG. 1A may lead to increased costs, due to the elaborate layout and the use of multiple high-side drivers 108.

FIG. 1B includes a graph 120 showing a driving voltage pulse 122 (e.g., a gate control voltage pulse) that may be provided by a high-side driver 108 at the respective semiconductor transistor 106 in the configuration of the light emitting device 100a illustrated in FIG. 1A. As a numerical example, the driving voltage pulse 122 may have a rising time of about 6 ns.

A loss of performance in the light emitting device 100a shown in FIG. 1A may be due to the presence of jitter among the high-side drivers 108. A jitter in the range from about 10 ns to about 20 ns, which may be present in a usual high-side driver, is greater than the pulse width to be achieved.

In another configuration, shown for example in FIG. 1C, a light emitting device 100b may include an individual high-side driver 108-1 to control more than one, e.g. each, semiconductor transistor 106 (e.g., the four semiconductor transistors 106-1, 106-2, 106-3, 106-4 in the exemplary configuration of FIG. 1C). The use of an individual high-side driver obviates the issue caused by the jitter described above. However, the input capacitances of the semiconductor transistors 106 add up, so that the rise of the control voltage (e.g., of the gate voltage) is slowed down compared to the configuration of the light emitting device 100a shown in FIG. 1A.

FIG. 1D includes a graph 124 showing a driving voltage pulse 126 that may be provided by the high-side driver 108-1 at the (four) semiconductor transistors 106 in the light emitting device 100b illustrated in FIG. 1C. As a numerical example, the driving voltage pulse 126 may have a rising time of about 17 ns, which may be greater than the rising time described in relation to FIG. 1B due to the increased input capacitance seen by the high-side driver 108-1 with respect to the configuration shown in FIG. 1A.

In another configuration, shown for example in FIG. 1E, a light emitting device 100c may include an individual high-side driver 108-1 to control an individual semiconductor transistor 106-1 that controls the current flow to more than one laser diode 102 (e.g., to four laser diodes 102-1, 102-2, 102-3, 102-4 in the exemplary configuration of FIG. 1E). The configuration of the light emitting device 100c may have a simplified layout compared to the light emitting devices 100a, 100b shown in FIG. 1A and FIG. 1C, and the use of an individual high-side driver obviates the issue caused by the jitter described above. However, the semiconductor transistor 106 has an increased input capacitance for driving the (four) laser diodes 102, which leads to a slow rise of the control voltage.

Figure 1F:
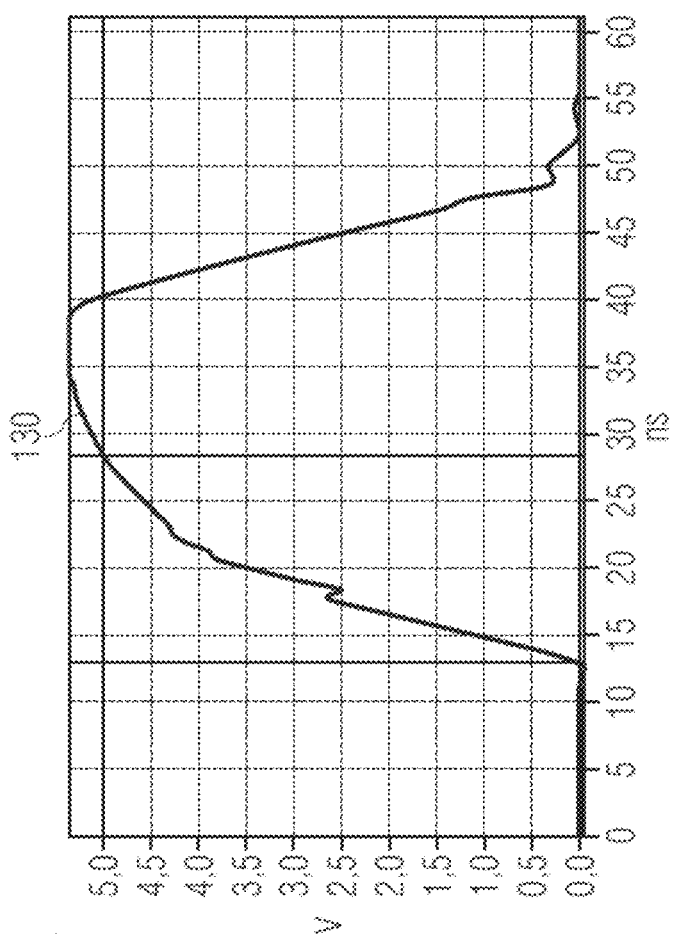

FIG. 1F and FIG. 1G include a respective graph 128, 132 showing a driving voltage pulse 130, 134 that may be provided by two different types of high-side driver that the light emitting device 100c illustrated in FIG. 1E may include. In both cases, the driving voltage pulse may have a relatively slow rise, e.g., as numerical examples, the driving voltage pulse 130 in FIG. 1F may have a rising time of about 15 ns, and the driving voltage pulse 134 in FIG. 1G may have a rising time of about 12 ns.

A loss of performance in the light emitting devices 100b, 100c shown in FIG. 1C and FIG. 1E may be due to the slow rise of the driving voltage pulses. Illustratively, the rise time may be greater than the pulse width to be achieved.

A complicating factor for the technical implementation of a suitable gate control is that usually there may be no ground reference of the gate control voltage. Due to circuit reasons, high-side drivers allow significantly shorter rise times of the gate voltage compared to, for example, low-side drivers. However, a high-side driver providing a control voltage with a rise time around 5 ns to 10 ns for driving high gate capacitances may be difficult to implement, or in any case very expensive. Furthermore, a voltage exceeding the maximum gate voltage of a GaN-FET (e.g., about 6 V) is usually provided to drive high gate charging currents. Thus a "bottleneck" currently exists in view of the available driver circuits.

Various embodiments of the present disclosure may be related to providing an improved strategy for driving a light source to generate narrow light pulses. Various embodiments may be related to a driving arrangement that enables using a high driving voltage (e.g., higher than the voltage that a semiconductor transistor may withstand) to provide fast charging of an input capacitance. Various embodiments may be related to a light emitting device configured to generate narrow light pulses without relying on sophisticated or expensive driver circuits, as described in further detail below for example in relation to FIG. 2 to FIG. 7B.

In the context of the present disclosure, reference may be made to a LIDAR system. It is however understood that a LIDAR system is only an example of a possible application of the light emitting device and of the driving arrangement described herein. The light emitting device and the driving arrangement may also be used in other types of applications or systems in which fast control over the power (e.g., a current) provided to a light source may be beneficial, e.g. in other applications or systems in which narrow light pulses should be generated, for example in communication systems configured to transmit data by means of light-based communication.

Figure 2:
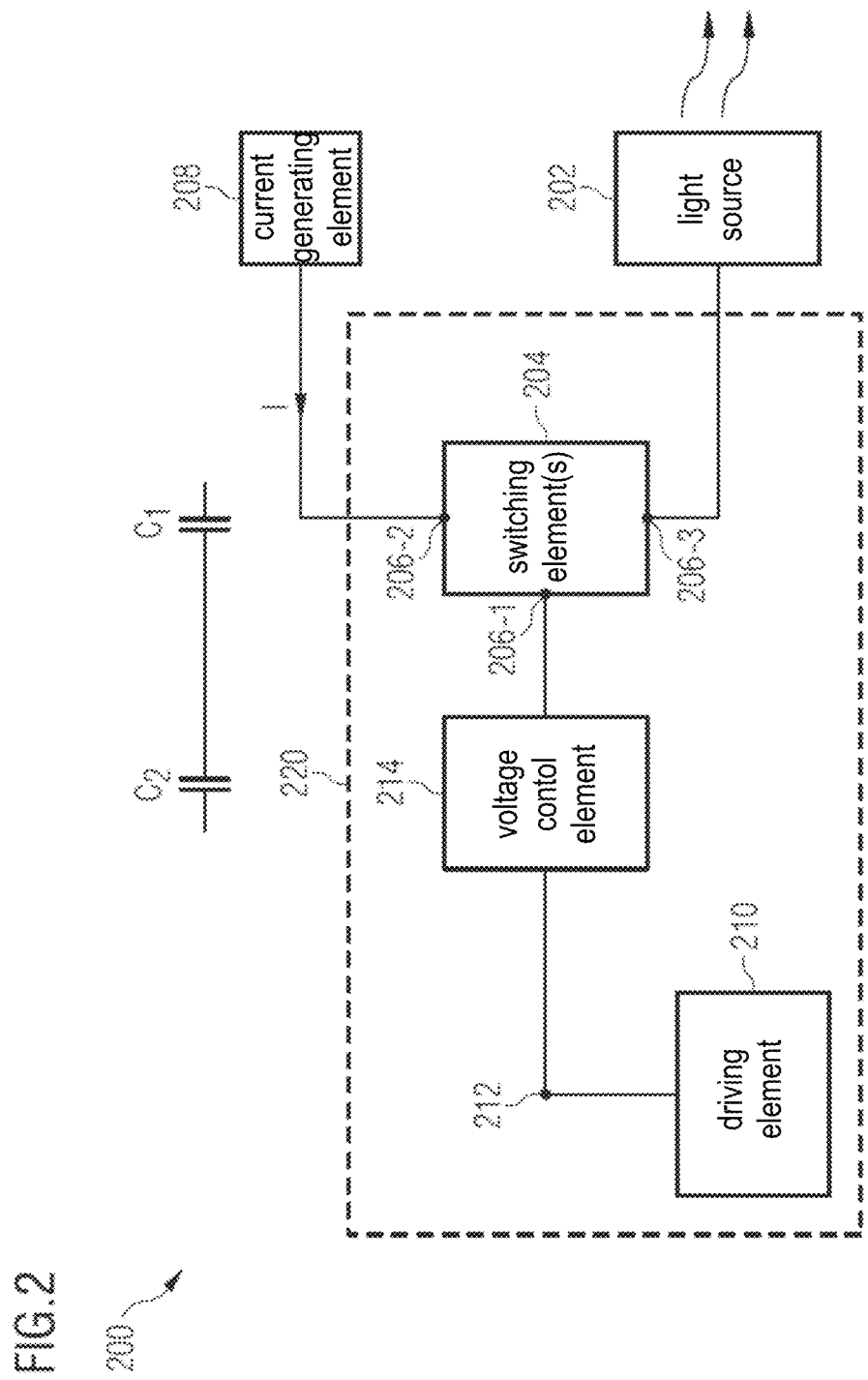
FIG. 2 shows schematically a light emitting device according to various embodiments.

FIG. 2 shows a light emitting device 200 in a schematic view according to various embodiments. It is understood that the configuration shown in FIG. 2 may be simplified for purpose of explanation. In some embodiments, a LIDAR system may include one or more light emitting devices 200.

The light emitting device 200 may include a light source 202. The light source 202 may be configured to emit light having a predefined wavelength, for example in the infra-red and/or near infra-red range, such as in the range from about 700 nm to about 5000 nm, for example in the range from about 860 nm to about 1600 nm, or for example at 905 nm or 1550 nm. The light source 202 may be configured to emit light in a pulsed manner, for example the light source 202 may be configured to emit one or more light pulses (e.g., a sequence of light pulses). In some embodiments, the light source 202 may be configured to emit a light pulse upon receiving a corresponding driving current (e.g., a corresponding current pulse). In some embodiments, the light source 202 may include a light emitting diode. In some embodiments, the light source 202 may include a plurality of light sources, e.g. a plurality of light emitting diodes, for example coupled in parallel with one another (see also FIG. 6A and FIG. 6B).

In some embodiments, the light source 202 may include a laser source. By way of example the light source 202 may include one or more laser diodes, e.g. one or more edge-emitting laser diodes or one or more vertical cavity surface emitting laser diodes. In some embodiments, the light source 202 may include a plurality of laser diodes, for example coupled in parallel with one another (see also FIG. 6A and FIG. 6B). The light source 202 may be configured to emit one or more laser pulses, e.g. a sequence of laser pulses. In some embodiments, the light source 202 may be configured to emit a laser pulse upon receiving a corresponding driving current (e.g., a corresponding current pulse).

The light emitting device 200 may include a switching element 204 (e.g., as part of a driving arrangement 220) configured to control a current flow to the light source 202. The switching element 204 may be configured to allow or prevent a current flow to the light source 202 (e.g., to allow or prevent a current pulse to be provided at the light source 202) to correspondingly allow or prevent light emission by the light source 202.

In some embodiments, for example in case the light source 202 includes a plurality of light sources (e.g., a plurality of parallel-coupled laser diodes), the switching element 204 may be configured to control a current flow to each light source of the plurality of light sources. Illustratively, the switching element 204 may be coupled to a node common to each light source to allow or prevent a current flow to the plurality of light sources.

In some embodiments, the switching element 204 may include a plurality of switching elements. As an example, more than one switching element may be assigned to one light source, e.g. in case a high current is to be provided to the light source. Illustratively, a plurality of switching elements may be coupled to an individual light source to control the current flow thereto. As another example, each switching element 204 of a plurality of switching elements may be assigned (e.g., coupled) to a respective light source of a plurality of light sources to control the current flow thereto. Each switching element 204 of a plurality of switching elements may be assigned to respective one or more light sources to control the current flow thereto.

Figure 3:
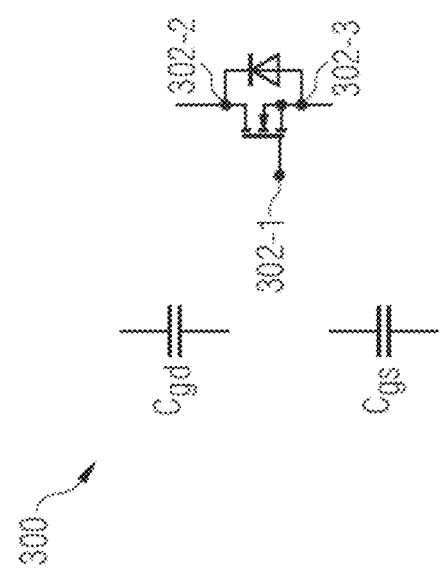
FIG. 3 shows schematically a switching element according to various embodiments.

In some embodiments, the switching element 204 may include one or more control nodes (see also FIG. 3). The switching element 204 may include a second control node 206-2, a third control node 206-3, and a first control node 206-1 (also referred to herein as input node or input) to control an electrical behavior of the second control node 206-2 and the third control node 206-3 of the switching element 204 (e.g., to control a current flow between the second control node 206-2 and the third control node 206-3). The light source 202 and the switching element 204 may be coupled with one another, e.g. at one of the second control node 206-2 or the third control node 206-3 (for example at the third control node 206-3 in the configuration shown in FIG. 2).

The switching element 204 may be configured to control a current flow to the light source 202 in accordance with a control signal provided at the input node 206-1, e.g. in accordance with an input voltage provided at the input node 206-1. An allowed current flow between the second control node 206-2 and the third control node 206-3 may increase for a correspondingly increasing input voltage. Illustratively, the switching element 204 may be configured to receive a current at one of the second control node 206-2 or the third control node 206-3, and to provide the received current at the other one of the second control node 206-2 or the third control node 206-3 in accordance with a control signal provided at the first control node 206-1.

The switching element 204 may be configured, in a first state, to prevent a current flow to the light source 202, e.g. to prevent a current flow between the second control node 206-2 and the third control node 206-3. The switching element 204 may be configured, in a second state, to allow a current flow to the light source 202, e.g. to allow a current flow between the second control node 206-2 and the third control node 206-3. The switching element 204 may be configured to switch from the first state to the second state (or vice versa) in accordance with a control signal provided at the input node 206-1 (in some embodiments, in accordance with an input voltage provided at the input node 206-1).

The properties of the control signal, e.g. the rise time of the input voltage, may define the timing of the switching from the current flow being prevented to the current flow being allowed. Illustratively, a time that it takes for the input voltage to rise from a reference voltage level (e.g., ground, or 0 V) to a voltage level suitable for driving the switching element 204 to allow the current flow to the light source 202 may define the speed with which the current is provided at the light source 202 (and consequently the duration of an emitted light pulse).

In some embodiments, the switching element 204 may have an input capacitance associated therewith (e.g., a first capacitance $C_1$, also referred to as input capacitance, as shown in the circuit equivalent in FIG. 2). The switching element 204 may be configured to control the current flow to the light source 202 in accordance with a charging of the input capacitance $C_1$. The switching element 204 may be configured to prevent a current flow to the light source 202 in case the input capacitance $C_1$ is not charged, and may be configured to allow a current flow to the light source 202 upon charging of the input capacitance $C_1$. The switching element 204 may be configured to switch from the first state into the second state (or vice versa) in accordance with the charging of the input capacitance. The timing with which the input capacitance $C_1$ is charged may define the timing with which the current is provided to the light source 202, and may influence the properties of the emitted light (e.g., of an emitted light pulse).

The input capacitance $C_1$ may be associated with a structural configuration of the switching element 204, as described in further detail below, for example in relation to FIG. 3. The charging of the input capacitance $C_1$ may be provided by the control signal provided at the input node 206-1 of the switching element, as described in further detail below. In some embodiments, the input capacitance $C_1$ may be understood as a capacitance associated with the input node 206-1 of the switching element 204.

In some embodiments, the light emitting device 200 may include a current generating element 208 configured to provide a current to the light source 202. The current generating element 208 may be configured to generate one or more current pulses to be provided at the light source 202. The current generating element 208 and the switching element 204 may be coupled with one another, e.g. at the other one of the second control node 206-2 or the third control node 206-3 with respect to the light source 202 (for example at the second control node 206-2 in the configuration shown in FIG. 2). The switching element 204 may be, in some embodiments, a high-side switch, connecting the current generating element 208 with the light source 202.

In some embodiments, the current generating element 208 may include a charge storage element, e.g. a capacitor. The switching element 204 may be configured to control the current flow to the light source 202 by controlling a discharge of the charge storage element, illustratively by allowing or preventing a discharge of the charge storage element.

The light source 202 may be configured to emit a light pulse upon receiving a current pulse provided by the discharging of the charge storage element. The properties of the current pulse provided by the discharging may influence the properties of a light pulse emitted by the light source 202. As an example, the height (in other words, the amplitude) of the current pulse may define or influence the height of an emitted light pulse. As another example, the duration of the current pulse may define or influence the duration of the light pulse.

As a numerical example, the charge storage element may be configured to allow a complete discharging in less than 15 ns, or less than 10 ns, or less than 6 ns. It is understood that the properties of charge storage element (e.g. the capacitance, the area, and the like) may be adapted depending on the desired light emission, e.g. depending on the desired properties of an emitted light pulse. Only as a numerical example, the charge storage element may have a capacitance in the range from about 15 nF to about 40 nF, for example in the range from about 20 nF to about 30 nF.

It is also understood that the discharge of a charge storage element is only an example of a possible configuration for generating current pulses, and other configurations may be possible. As another example, the current generating element 208 may include a current source being turned on and off at a desired rate.

In some embodiments, the light emitting device 200 may include a driving element 210 (also referred to herein as driver circuit or driver) configured to provide a control signal for driving the switching element 204. The driving element 210 (e.g., as part of the driving arrangement 220) may be configured to provide a driving voltage at a voltage supply node 212 for driving the switching element 204. In some embodiments, e.g. in case the light emitting device 200 includes a plurality of switching elements 204, the light emitting device 200 may include a plurality of driving elements 210, each assigned to one or more of the switching elements 204 (illustratively, each configured to provide a control signal, e.g. a driving voltage, for driving the respective one or more switching elements). The driving element 210 may include or may control one or more voltage supply circuits that may be used for supplying the driving voltage. The driving element 210 may include, in some embodiments, a high-side driver.

The driving element 210 may be configured to provide at the voltage supply node 212 a driving voltage greater than a maximum allowable input voltage of the switching element 204. As an example, the driving voltage may be at least 1.5 times greater than the maximum allowable input voltage, for example at least two times greater than the maximum allowable input voltage, for example at least three times greater than the maximum allowable input voltage, for example at least five times greater than the maximum allowable input voltage.

As a numerical example, the driving element 210 may be configured to provide at the voltage supply node 212 a driving voltage having an absolute value greater than 5 V, or greater than 10 V, or greater than 12 V, or greater than 15 V. As another numerical example, the driving element 210 may be configured to provide at the voltage supply node 212 a driving voltage having an absolute value in the range from 5 V to 25 V, for example in the range from 10 V to 20 V. As another numerical example, the maximum allowable input voltage of the switching element 204 may be equal to or less than 6 V, for example equal to or less than 10 V or equal to or less than 8 V. As another numerical example, the maximum allowable input voltage of the switching element 204 may be in the range from 2 V to 15 V, for example in the range from 4 V to 8 V.

In some embodiments, e.g. in case the switching element 204 includes a semiconductor transistor, the driving element 210 may be configured to provide a driving voltage at the supply node 212 greater than a threshold voltage of the semiconductor transistor. By way of example, the driving voltage may be at least 1.5 times greater than the threshold voltage of the semiconductor transistor, for example at least two times greater than the threshold voltage of the semiconductor transistor, for example at least five times greater than the threshold voltage of the semiconductor transistor, for example at least ten times greater than the threshold voltage of the semiconductor transistor.

Illustratively, the driving voltage may be not limited as long as it is greater than the maximum allowable input voltage of the switching element 204 (e.g., as long as an absolute value of the driving voltage is greater than an absolute value of the maximum allowable input voltage). The driving voltage may be adapted in accordance with a desired operation of the light emitting device 200, and in accordance with the properties of the components of the light emitting device 200 as described in further detail below.

A maximum allowable input voltage may be understood as a maximum voltage that the switching element 204 may withstand, e.g. a maximum voltage with which the switching element 204 may be operated without being damaged or without having the risk of being damaged. Illustratively, a maximum allowable input voltage may be understood as a maximum voltage that may be provided at the switching element 204 (e.g., at the input node 206-1), above which the switching element 204 may malfunction or may be irreparably damaged. In some embodiments, as described in further detail below, in case the switching element 204 includes a field-effect transistor, the maximum allowable input voltage may include a maximum gate-source voltage of the field-effect transistor, that is a maximum difference between a voltage provided at the gate node and a voltage provided at the source node that ensures that the field-effect transistor is not damaged. By way of illustration, the maximum allowable input voltage may be understood as the maximum voltage that would be provided at the switching element 204 in case the strategy described in further detail below was not implemented. For example, the high-side drivers 108 described in relation to the light emitting devices 100a, 100b, 100c shown in FIG. 1A, FIG. 1C, and FIG. 1E, would not be configured to provide a driving voltage greater than a maximum gate-source voltage of the respective semiconductor transistors 106, as this would lead to damaging or destroying the transistors 106. In some embodiments, the maximum allowable input voltage may be understood as a maximum allowable voltage drop between the input node 206-1 and the node coupled with the light source 202, e.g. a maximum allowable voltage drop between the input node 206-1 and the third node 206-3 in the configuration shown in FIG. 2.

In some embodiments, the driving element 210 may be further configured to provide a reference voltage at the control node of the switching element 204 coupled with the light source 202, e.g. at the third control node 206-3 in the exemplary configuration shown in FIG. 2 (e.g., in some embodiments the driving element 210 and the third control node 206-3 may be coupled with one another). Illustratively, the driving element 210 may be configured to maintain the third control node 206-3 at a reference voltage (illustratively, at a reference potential). In some embodiments, the reference voltage may vary over time, in accordance with the current flow allowed or prevented by the switching element 204. In some embodiments, the maximum allowable voltage may be understood as a maximum allowable voltage difference between a voltage provided at the input node 206-1 and the reference voltage provided at the control node of the switching element 204 coupled with the light source 202 (e.g., the reference voltage provided at the third control node 206-3).

In some embodiments, the light emitting device 200 may include a voltage control element 214 (e.g., as part of the driving arrangement 220) coupled with the switching element 204 and with the voltage supply node 212. The voltage control element 214 and the switching element 204 may be coupled with one another at the input node 206-1, illustratively the voltage control element 214 and the input node 206-1 may be coupled with one another.

The voltage control element 214 may be configured to regulate a voltage being provided at the switching element 204. The voltage control element 214 may be configured to adapt the voltage provided at the voltage supply node 212 such that an input voltage at the input node 206-1 does not exceed the maximum allowable input voltage of the switching element 204. The combination of providing a high driving voltage at the voltage supply node 212 with the voltage regulation operated by the voltage control element 214 ensures that the input voltage at the input node 206-1 may rise in a short time (e.g., in less than 10 ns, or in less than 8 ns) to the voltage level that controls the switching element 204 to allow the current flow to the light source 202, without having the risk of damaging the switching element 204.

In some embodiments, the voltage control element 214 may include a plurality of voltage control elements 214, each assigned to a respective switching element 204, e.g. each coupled with a respective switching element 204.

In some embodiments, the voltage control element 214 may have a capacitance associated therewith (e.g., a second capacitance $C_2$). The voltage control element 214 and the switching element 204 may be coupled to one another such that a capacitive voltage divider is provided. In other words, the voltage control element 214 and the input 206-1 of the switching element 204 may be coupled to one another in such a way that the voltage control element 214 and the input 206-1 of the switching element 204 form a capacitive voltage divider. Illustratively, the voltage control element 214 and the input 206-1 of the switching element 204 are coupled to one another such that the driving voltage provided at the voltage supply node 212 is distributed across the voltage control element 214 and the input 206-1 of the switching element 204. The voltage distribution may be determined by voltage divider calculations for a series connection of the input capacitance $C_1$ and the second capacitance $C_2$. Illustratively, the input 206-1 of the switching element 204 and the voltage control element 214 may be coupled in series with one another, so that the respective capacitances are in series with one another.

The input 206-1 of the switching element 204 and the voltage control element 214 may be coupled to one another in such a way that a first portion (in other words, a first fraction) of the driving voltage is provided at the input 206-1 of the switching element 204 (as input voltage), and a second portion (in other words, a second fraction) of the driving voltage drops across the voltage control element 214. In some embodiments, e.g. in case the switching element 204 includes a semiconductor transistor, the (first) portion of the driving voltage provided at the switching element 204 may be (or may define) a gate-source voltage of the semiconductor transistor, as described in further detail below, for example in relation to FIG. 3.

In some embodiments, the driving voltage provided at the voltage supply node 212 may be understood as the voltage dropping across the voltage supply node 212 and the control node of the switching element 204 coupled with the light source 202, e.g. the voltage drop across the voltage supply node 212 and the third control node 206-3. The first portion of the driving voltage provided at the switching element 204 may be understood as the portion of the driving voltage dropping across the input node 206-1 and the third control node 206-3. The second portion of the driving voltage may be understood as the portion of the driving voltage dropping across the voltage control element 214, e.g. dropping across two nodes associated with the voltage control element 214 (e.g., dropping across the voltage supply node 212 and the input node 206-1).

The input capacitance $C_1$ associated with the switching element 204 and the second capacitance $C_2$ associated with the voltage control element 214 may be selected to adjust the voltage distribution, illustratively to adjust the voltage provided as input voltage and the voltage drop across the voltage control element. The input capacitance $C_1$ and the second capacitance $C_2$ may be selected in accordance with the driving voltage, e.g. in accordance with the amount by which the driving voltage provided at the voltage supply node 212 exceeds the maximum allowable input voltage. A relationship between the input capacitance $C_1$ and the second capacitance $C_2$ may be in accordance with a relationship between the driving voltage and the maximum allowable input voltage. A relationship between the first portion of the driving voltage provided at the switching element 204 and the second portion of the driving voltage dropping across the voltage control element 214 may be in accordance with the relationship between the driving voltage and the maximum allowable input voltage, e.g. in accordance with the relationship between the input capacitance $C_1$ and the second capacitance $C_2$.

The input capacitance $C_1$ and the second capacitance $C_2$ may be selected in accordance with a relationship between the driving voltage and the maximum allowable input voltage (in other words, based on a relationship between the driving voltage and the maximum allowable input voltage), e.g. in accordance with a ratio of the driving voltage to the maximum allowable input voltage.

By way of illustration, the input capacitance $C_1$ and the second capacitance $C_2$ may be selected such that the first portion of the driving voltage provided at the switching element 204 does not exceed the maximum allowable input voltage, and such that the excess voltage drops across the voltage control element 214 (as second portion of the driving voltage). Denoting, for example, the voltage across the input capacitance (illustratively, the maximum allowable input voltage) as $V_{C1}$ and the driving voltage as $V_D$, the second capacitance $C_2$ may be dimensioned as $C_2=[V_{C1}/(V_D-V_{C1})]*C_1$.

In some embodiments, in case the driving element 210 is configured to provide a driving voltage at the voltage supply node 212 equal to twice the maximum allowable input voltage ($V_D=2*V_{C1}$), the input capacitance $C_1$ and the second capacitance $C_2$ may be equal to one another ($C_1=C_2$). In this configuration, the first portion of the driving voltage provided at the switching element 204 and the second portion of the driving voltage dropping across the voltage control element 214 may be equal to one another ($V_{C1}=V_{C2}$, where $V_{C2}$ may denote the voltage dropping across the voltage control element 214). Illustratively, the input capacitance $C_1$ and the second capacitance $C_2$ may be dimensioned such that the driving voltage is equally distributed between the voltage control element 214 and the switching element 204.

In some embodiments, in case the driving element 210 is configured to provide a driving voltage at the voltage supply node 212 greater than twice the maximum allowable input voltage ($V_D>2*V_{C1}$), the second capacitance $C_2$ may be less than the input capacitance ($C_2<C_1$). In this configuration, the second portion of the driving voltage dropping across the voltage control element 214 may be greater than the first portion of the driving voltage provided at the switching element 204 ($V_{C2}>V_{C1}$). Illustratively, in some embodiments, the input capacitance $C_1$ and the second capacitance $C_2$ may be selected such that the (second) portion of the driving voltage dropping across the voltage control element 214 is greater than the (first) portion of the driving voltage provided at the input 206-1 of the switching element 204. As an example, the input capacitance $C_1$ may be at least 1.5 times greater than the second capacitance $C_2$, or at least two times greater than the second capacitance $C_2$, or at least three times greater than the second capacitance $C_2$, or at least five times greater than the second capacitance $C_2$.

In some embodiments, in case the driving element 210 is configured to provide a driving voltage provided at the voltage supply node 212 less than twice the maximum allowable input voltage ($V_{C1}<V_D<2*V_{C1}$), the second capacitance $C_2$ may be greater than the input capacitance ($C_2>C_1$). In this configuration, the second portion of the driving voltage dropping across the voltage control element 214 may be less than the first portion of the driving voltage provided at the switching element 204 ($V_{C2}<V_{C1}$). Illustratively, in some embodiments, the input capacitance $C_1$ and the second capacitance $C_2$ may be selected such that the (second) portion of the driving voltage dropping across the voltage control element 214 is less than the (first) portion of the driving voltage provided at the input 206-1 of the switching element 204. As an example, the second capacitance $C_2$ may be at least 1.5 times greater than the input capacitance $C_1$, or at least two times greater than the input capacitance $C_1$, or at least three times greater than the input capacitance $C_1$, or at least five times greater than the input capacitance $C_1$.

It is understood that the considerations above in relation to twice the maximum allowable input voltage may apply to the exemplary configuration of the light emitting device 200 in FIG. 2 in which the driving voltage provided at the voltage supply node 212 is distributed between two elements (illustratively, between the voltage control element 214 and the switching element 204). The considerations above may be correspondingly adapted in case the light emitting device 200 includes more than one voltage control element 214 associated with the switching element 204, e.g. in case the light emitting device 200 includes a further voltage control element having a third capacitance coupled in series with the voltage control element 214 (or a plurality of further voltage control elements coupled in series with the voltage control element 214). In this configuration, the considerations above may be adapted according to equations known in the art for describing the relationships between the capacitances (e.g., the considerations above may be adapted considering the driving voltage being less than, equal to, or greater than three times the maximum allowable input voltage, or of a suitable multiple of the maximum allowable input voltage).

The portion of the driving voltage provided at the input 206-1 may be reduced by reducing the second capacitance $C_2$, or by increasing the input capacitance $C_1$ relative to the second capacitance $C_2$.

The series connection of the voltage control element 214 and of the input 206-1 of the switching element 204 may provide that a same current flows through both components. Illustratively, the driving voltage provided at the voltage supply node 212 provides a driving current flowing in direction of the voltage control element 214 and of the switching element 204. In view of the series connection, a same current may flow in both capacitive components, and the input capacitance $C_1$ and the second capacitance $C_2$ may receive a same current (a same amount of charge provided by the current). Across the component with greater capacitance appears a lower voltage compared to the component with lower capacitance. Providing a high driving voltage (at the voltage supply node 212) leads to a high current (and a high amount of charge) at the input 206-1 of the switching element 204 for providing a fast charging of the input capacitance $C_1$.

In some embodiments, the voltage control element 214 may be configured such that the second capacitance $C_2$ is fully charged in case the first portion of the driving voltage provided at the input 206-1 of the switching element 204 is substantially equal to the maximum allowable input voltage of the switching element 204. Illustratively, the second capacitance $C_2$ may be dimensioned such that a charging of the second capacitance $C_2$ is completed upon completion of the charging of the input capacitance $C_1$. This ensures that the voltage at the input 206-1 does not increase further, thus preventing damage to the switching element 204.

In some embodiments, a ratio $C_1/C_2$ of the input capacitance $C_1$ to the second capacitance $C_2$ may be proportional (in some embodiments, approximately equal) to a ratio of the driving voltage provided by the driving element 210 at the voltage supply node 212 to the maximum allowable input voltage of the switching element 204 ($C_1/C_2$ α

$V_D/V_{C1}$). In some embodiments, a ratio $C_1/C_2$ of the input capacitance $C_1$ to the second capacitance $C_2$ may be approximately equal to a ratio of a difference between the driving voltage provided by the driving element 210 at the voltage supply node 212 and the maximum allowable input voltage of the switching element 204 to the maximum allowable input voltage of the switching element 204 ($C_1/C_2 = (V_D - V_{C1})/V_{C1}$). As described above, the second capacitance $C_2$ may be dimensioned in accordance with the input capacitance $C_1$ and with the driving voltage that the driving element 210 may provide. Only as a numerical example, the driving voltage may be 18 V, which provides a high current, and the second capacitance $C_2$ may be one third of the input capacitance $C_1$ (for example in the case that the maximum allowable input voltage is 6 V).

FIG. 3 shows a switching element 300 in a schematic view according to various embodiments. The switching element 300 may be an exemplary realization of the switching element 204 described in relation to FIG. 2.

In some embodiments, the switching element 300 may include a semiconductor transistor (also referred to herein as power semiconductor transistor). As shown in FIG. 3, the semiconductor transistor may include a field-effect transistor, such as a metal oxide semiconductor field effect transistor (e.g., an n-channel MOS-FET) or a gallium nitride field effect transistor (with an intrinsic body diode, as shown in FIG. 3). It is understood that the configuration shown in FIG. 3 is only an example, and other configurations of a switching element may be provided, as an example a switching element may include a vacuum tube. It is also understood that other configurations of the semiconductor transistor 300 may be provided. As another example, the semiconductor transistor may include an insulated gate bipolar transistor.

The semiconductor transistor 300 may include a second control node 302-2, a third control node 302-3, and a first control node 302-1 to control an electrical behaviour of the second control node 302-2 and the third control node 302-3. Illustratively, the first control node 302-1, the second control node 302-2, and the third control node 302-3, may be an exemplary realization of the first control node 206-1, the second control node 206-2, and the third control node 206-3 described in relation to FIG. 2, respectively.

In some embodiments, the first control node 302-1 may be a gate node of the semiconductor transistor 300, the second control node 302-2 may be one of a source node or a drain node, and the third control node 302-3 may be the other one of the source node or the drain node. In the configuration shown in FIG. 3, the second control node 302-2 may be the drain node, and the third control node 302-3 may be the source node. In case the semiconductor transistor includes an insulated gate bipolar transistor, the second control node 302-2 may be a collector node, and the third control node 302-3 may be an emitter node, as an example.

In some embodiments, an input capacitance of the semiconductor transistor 300 may be a gate capacitance. The semiconductor transistor 300 may be configured to prevent a current flow between the source node and the drain node unless the gate capacitance is charged. Illustratively, the semiconductor transistor 300 may be configured to switch from a non-conducting state into a conducting state in case a voltage at the gate node 302-1 reaches a threshold voltage of the semiconductor transistor 300, and may be configured such that the voltage at the gate node 302-1 does not increase unless the gate capacitance is charged. The gate capacitance of the semiconductor transistor 300 may be a combination of a gate-source capacitance $C_{gs}$ and a gate-drain capacitance $C_{gd}$ of the semiconductor transistor 300, as commonly known in the art.

In some embodiments, a maximum allowable input voltage of the semiconductor transistor 300 may be a maximum allowable gate-source voltage of the semiconductor transistor. Illustratively, a maximum allowable input voltage of the semiconductor transistor 300 may be a maximum difference between a (gate) voltage provided at the gate node 302-1 and a (source) voltage provided at the source node 302-3. As a numerical example, the maximum allowable gate-source voltage may be equal to or less than 6 V (e.g., in case the semiconductor transistor includes a GaN-FET). As another numerical example, the maximum allowable gate-source voltage may be in the range from 2 V to 15 V, for example in the range from 4 V to 8 V.

In some embodiments, an input voltage provided at the gate node 302-1 of the semiconductor transistor 300 may be understood as a gate-source voltage of the semiconductor transistor 300, assuming that the source node 302-3 is provided with a reference voltage (illustratively, assuming that the source node 302-3 is at a reference potential). In some embodiments, it may be possible to provide an input voltage at the source node 302-3 while providing a reference voltage at the gate node 302-1 to control the current flow in the semiconductor transistor 300, depending on the configuration of the semiconductor transistor 300.

Figure 4:
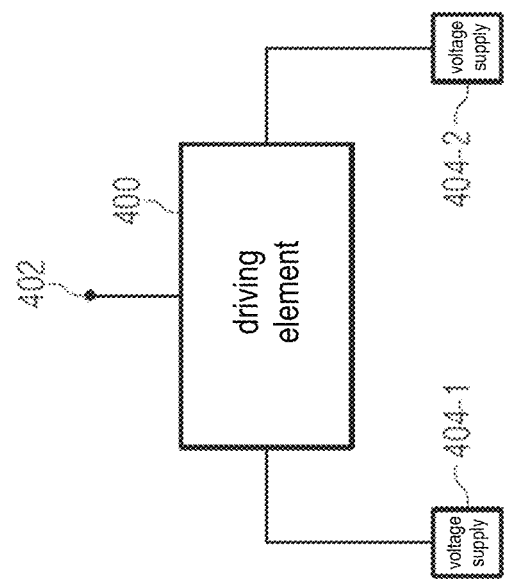
FIG. 4 shows schematically a driving element according to various embodiments.

FIG. 4 shows a driving element 400 in a schematic view according to various embodiments. The driving element 400 may be an exemplary realization of the driving element 210 described in relation to FIG. 2. The driving element 400 may include a high-side driver. In some embodiments, the driving element 400 may be understood as a gate driver or as a gate driver circuit.

In some embodiments, the driving element 400 may be configured to provide an output voltage at an output node 402. The output voltage may be a driving voltage for driving a switching element. Illustratively the output node 402 may be a voltage supply node, or may be coupled with a voltage supply node (e.g., the voltage supply node 212 described in relation to FIG. 2).

In some embodiments, the driving element 400 may be configured to receive a plurality of supply voltages. The driving element 400 may be coupled with a plurality of voltage supplies (e.g., with a plurality of voltage sources). In the configuration shown in FIG. 4, the driving element 400 may be coupled to a first voltage supply 404-1 and to a second voltage supply 404-2.

The first voltage supply 404-1 may be configured to provide a first supply voltage, and the second voltage supply 404-2 may be configured to provide a second supply voltage. The first supply voltage may be for a logic operation of the driving element 400. Illustratively, the first supply voltage may be for powering internal logic of the driving element. The second supply voltage may be for providing the output voltage at the output node 402.

The driving element 400 may be configured to provide at the output node 402 a voltage generated by using the second supply voltage. The driving element 400 may include one or more processors configured to control the provision of the output voltage (e.g., the time at which the output voltage is provided), and the one or more processors may be powered by the first supply voltage.

The first supply voltage may be less than the second supply voltage. As a numerical example, the first supply voltage may be in the range from about 1V to about 10 V, for example from about 2 V to about 6 V (e.g., the first supply voltage may be about 5 V). As a further numerical example, the second supply voltage may be in the range from about 5 V to about 25 V, for example in the range from about 10 V to about 20 V (e.g., the first supply voltage may be about 15 V).

The use of more than one voltage supply provides a solution for enabling the driving element 400 to provide a (high) output voltage greater than a voltage used for controlling the operation of the driving element 400. It is understood that other configurations may be possible, e.g. with more than two voltage supplies, or with an individual voltage supply and internal circuitry of the driving element 400 to provide a portion of the voltage supply for the logic operation and another (e.g., amplified) portion as output voltage.

Figure 5A:
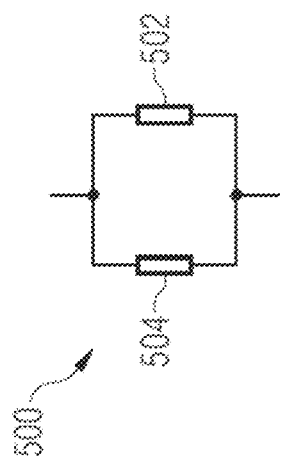
FIG. 5A, FIG. 5B, and FIG. 5C each shows schematically a voltage control element according to various embodiments.

FIG. 5A shows a voltage control element 500 in a schematic view according to various embodiments. The voltage control element 500 may be an exemplary realization of the voltage control element 214 described in relation to FIG. 2.

Figure 5C:
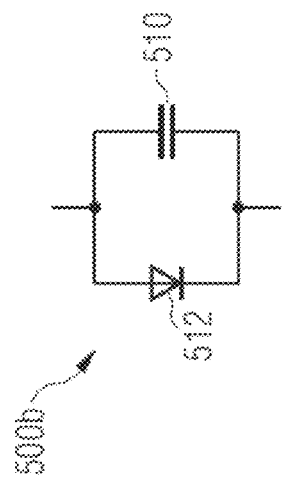
Figure 5B:
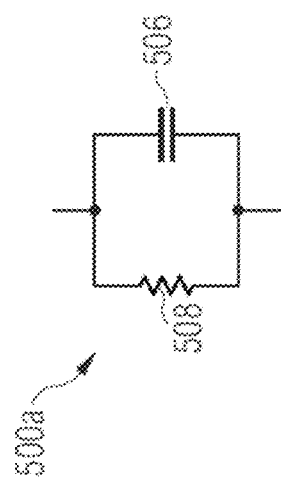

In some embodiments, the voltage control element 500 may include a capacitive element 502 (e.g., a capacitor, as shown in FIG. 5B and FIG. 5C). The capacitive element 502 may provide the capacitance associated with the voltage control element 500. Illustratively, a (second) capacitance associated with the voltage control element 500 may be a capacitance of the capacitive element 502 or may include a capacitance of the capacitive element 502 (e.g., a capacitance of the capacitor). As a numerical example, the capacitance associated with the voltage control element 500 may be in the range from about 0.5 nF to about 5 nF.

In some embodiments, the voltage control element 500 may include a resistive element 504 (e.g., a resistor as shown in FIG. 5B, or a diode as shown in FIG. 5C). The resistive element 504 be configured to provide a discharging path for a capacitance coupled to the voltage control element 500, e.g. for the input capacitance of a switching element (e.g., the switching element 204). Illustratively, the resistive element 504 may be configured to allow the input capacitance to discharge to switch the switching element, e.g. to prevent a current flow (and allow recharging of the charge storage element used to provide current pulses). The resistive element 504 and the capacitive element 502 may be coupled in parallel with one another.

The resistive element 504 may further be configured to provide or maintain a defined potential at an output node of the voltage control element. Illustratively, the resistive element 504 may be configured to provide or maintain a defined potential at an input of a switching element coupled with the voltage control element 500 (e.g., at the input 206-1 of the switching element 204), e.g. in a non-switched state of the switching element (a first state of the switching element).

In some embodiments, the voltage control element 500 may be understood as a passive network configured to provide a capacitive voltage divider configuration (illustratively, when coupled to the switching element 204). The voltage control element 500 may be understood as a passive network including a capacitive element 502 and a resistive element 504 coupled in parallel with one another.

FIG. 5B and FIG. 5C each shows a respective exemplary implementation 500a, 500b of the voltage control element 500 in a schematic view according to various embodiments.

As shown in FIG. 5B, the voltage control element 500 may include a capacitor 506 and a resistor 508 coupled in parallel with one another. As shown in FIG. 5C, the voltage control element 500 may include a capacitor 510 and a diode 512 coupled in parallel with one another. It is understood that the configurations shown in FIG. 5B and FIG. 5C are only an example, and other configurations of the voltage control element 500 may be possible to provide a capacitive voltage divider configuration with a switching element.

Figure 6A:
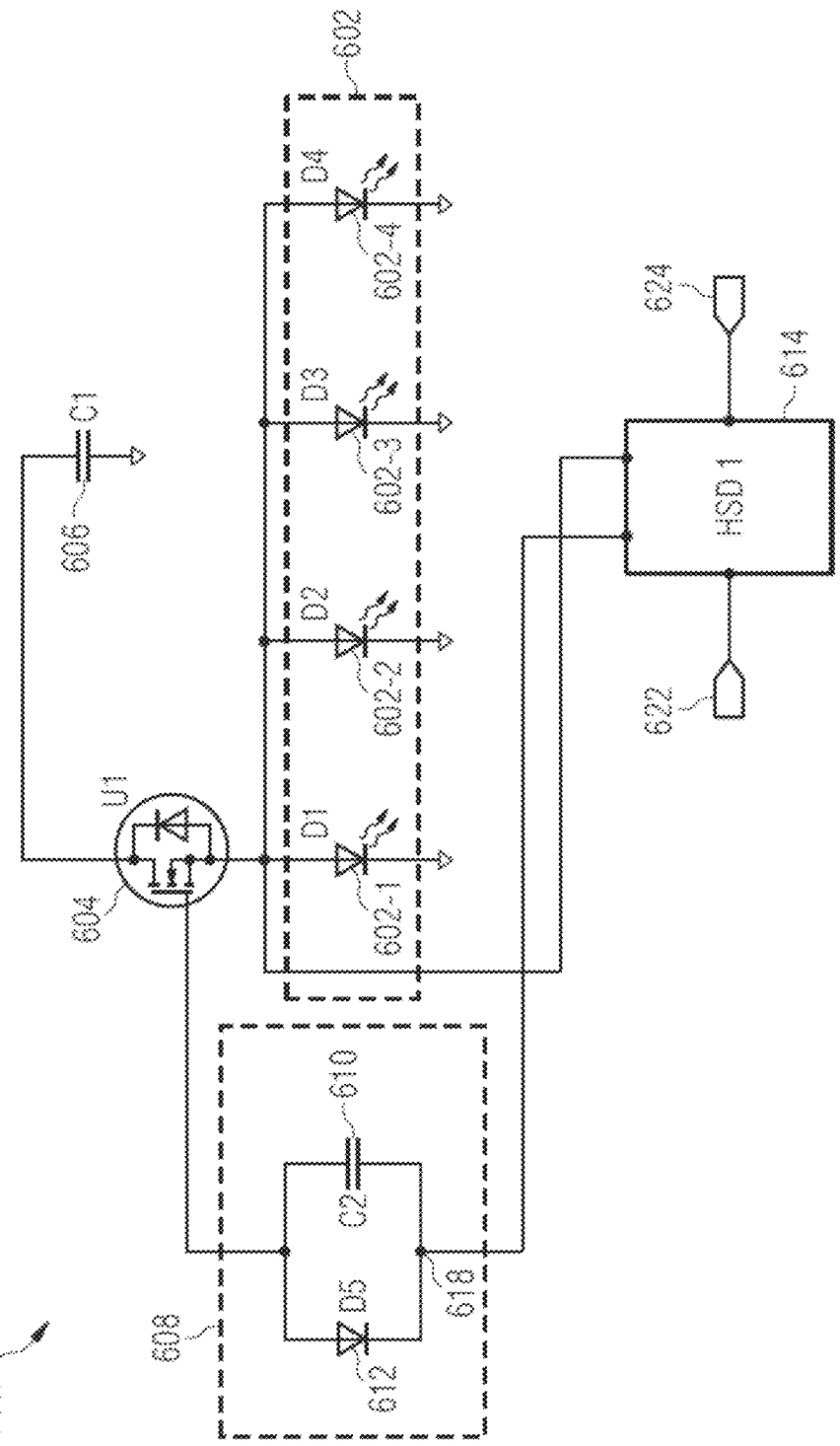

FIG. 6A and FIG. 6B each shows a respective light emitting device 600a, 600b in a schematic view according to various embodiments. The light emitting device 600a, 600b shown in FIG. 6A and FIG. 6B may be an exemplary realization of the light emitting device 200 described in relation to FIG. 2.

A light emitting device 600a, 600b may include a light source 602, for example including four laser diodes 602-1, 602-2, 602-3, 602-4 (D1, D2, D3, D4). The laser diodes 602-1, 602-2, 602-3, 602-4 may be connected to ground (individually, as shown in FIG. 6A, or to a common node, as shown in FIG. 6B).

The light emitting device 600a, 600b may include a switching element 604 (U1), e.g. a GaN-FET, to control a current flow to the laser diodes 602-1, 602-2, 602-3, 602-4, by controlling the discharge of a charge storage element 606 (e.g., of a capacitor C1, for example with a capacitance of 24.2 nF).

The light emitting device 600a, 600b may include a voltage control element 608 coupled with the switching element 604 to form a capacitive voltage divider. The voltage control element 608 may include a capacitive element 610 (e.g., a capacitor C2, for example with capacitance of 1 nF) and a resistive element 612 (e.g., a diode D5) coupled in parallel with one another. The voltage control element 608 may be coupled in series with the switching element 604, e.g. with an input of the switching element 604 (such as with a gate node of the GaN-FET).

The light emitting device 600a, 600b may include a driving element 614, 616 (e.g., a high-side driver HSD1) configured to provide a driving voltage to control the switching element 604 (e.g., at a voltage supply node 618, 620). The driving element 614, 616 may also be coupled with another control node of the switching element 604 (e.g., with a source node of the GaN-FET).

As shown in FIG. 6A, the driving element 614 may be coupled with a first voltage supply 622 configured to provide a first supply voltage (e.g., 6 V) for a logic operation of the driving element 614. The driving element 614 may be further coupled to a second voltage supply 624 configured to provide a second supply voltage (e.g., 18 V) for providing the driving voltage.

As shown in FIG. 6B, the driving element 616 may be coupled with a first voltage supply 626 configured to provide a first supply voltage (e.g., 5 V) for a logic operation of the driving element 616. The driving element 616 may be further coupled to a second voltage supply 628 configured to provide a second supply voltage (e.g., 18 V) for providing the driving voltage.

By way of illustration, the light emitting device 600a, 600b may be understood as a laser diode loop with high-side driver with a voltage of 18 V in the output loop and an additional (passive) network in the gate loop.

As shown in FIG. 6B, the driving element 616 may include additional inputs and outputs, for example a trigger input 630, and a terminal 632 coupled with the source node of the GaN-FET, as examples.

As shown in FIG. 6B, the light emitting device 600b may include additional components. The light emitting device 600b may include a resistor 634 and an inductor 636 coupled in series with the capacitor 606. The light emitting device 600b may include an inductor 638 coupled in series to the voltage control element 608, illustratively between the voltage control element 608 and the input of the switching element 604. The light emitting device 600b may include a diode 640 (D6) and a resistor 642 (R9) coupled in series with the second voltage supply 628, illustratively between the second voltage supply 628 and the driving element 616. The light emitting device 600b may include a capacitor 644 (C14), a resistor 646 (R10), and an inductor 648 coupled between the driving element 616 and the control node (e.g., the source node) of the switching element 604.

Figure 7A:
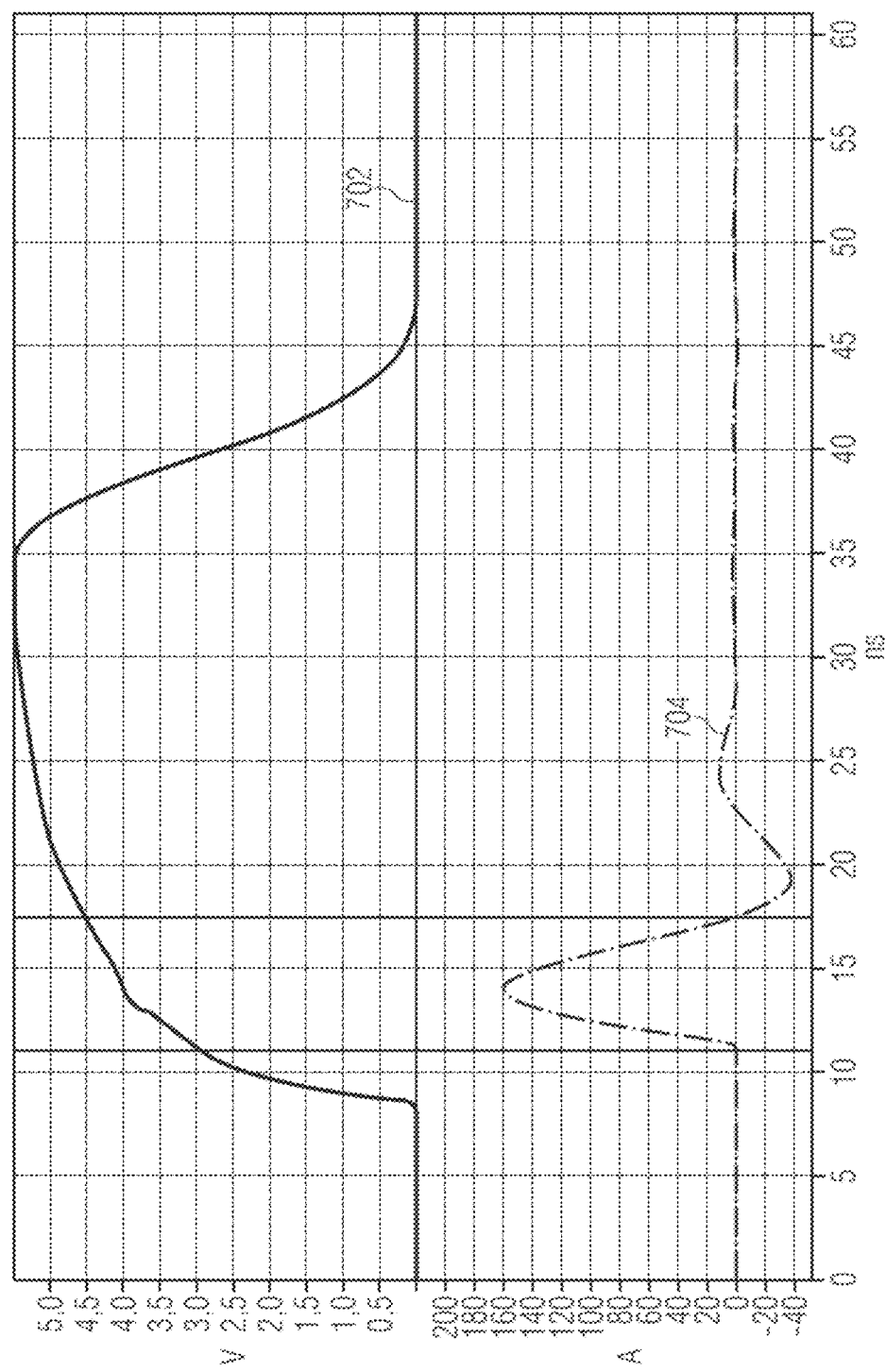

FIG. 7A and FIG. 7B each shows a respective graph 700a, 700b of a driving voltage provided at the input of a switching element in a configuration that does not implement the strategy described herein (FIG. 7A) and in a configuration implementing the strategy described herein (FIG. 7B), and the correspondingly generated laser pulse.

As shown in the graph 700a in FIG. 7A, without implementing the strategy described herein, a low or relatively lower driving voltage is used (e.g., 6 V), which leads to a slower rise of the input voltage 702 at a switching element, and to an emitted pulse 704 having a relatively lower amplitude (e.g., a relatively lower maximum current, e.g. 160 A) and a relatively greater pulse width (e.g., 6.4 ns) compared to the pulse described below in relation to FIG. 7B.

As shown in the graph 700b in FIG. 7B, by implementing the strategy described herein, e.g. by providing a high or relatively higher driving voltage (e.g., 18 V) in combination with the voltage control element (e.g., with a capacitor having capacitance of 1 nF), a laser pulse with improved properties may be emitted. In comparison to the input voltage 702 in FIG. 7A, the input voltage 706 at a switching element has a steeper rise (a steeper rising edge), and an emitted laser pulse 708 has greater amplitude (e.g., a greater maximum current, e.g. 180 A), and a narrower width (e.g., 5.5 ns). The steeper rise of the voltage provides a faster charging of the gate capacitance.

In the following, various embodiments of this disclosure will be illustrated.

Example 1 is a light emitting device including: a light source; a switching element having an input capacitance associated therewith, the switching element being configured to control a current flow to the light source in accordance with a charging of the input capacitance; a voltage control element coupled with the switching element and with a voltage supply node, the voltage control element having a second capacitance associated therewith, wherein the voltage control element and an input of the switching element are coupled to one another in such a way that the voltage control element and the input of the switching element form a capacitive voltage divider; and a driving element configured to provide a driving voltage at the voltage supply node, the driving voltage being greater than a maximum allowable input voltage of the switching element, and wherein a relationship between the input capacitance and the second capacitance is in accordance with a relationship between the driving voltage and the maximum allowable input voltage.

In Example 2, the subject-matter of example 1 may optionally further include that the input of the switching element and the voltage control element are coupled to one another in such a way that a first portion of the driving voltage is provided at the input of the switching element, and a second portion of the driving voltage drops across the voltage control element, and that a relationship between the first portion and the second portion is in accordance with the relationship between the input capacitance and the second capacitance.

A relationship between the input capacitance and the second capacitance, and a relationship between the first portion and the second portion may be as follows.

In some embodiments, in case the driving element is configured to provide a driving voltage at the voltage supply node equal to twice the maximum allowable input voltage of the switching element, the input capacitance and the second capacitance may be equal to one another. In this configuration, the first portion of the driving voltage provided at the switching element and the second portion of the driving voltage dropping across the voltage control element may be equal to one another.

In some embodiments, in case the driving element is configured to provide a driving voltage at the voltage supply node greater than twice the maximum allowable input voltage, the second capacitance may be less than the input capacitance (e.g., the input capacitance may be at least 1.5 times greater than the second capacitance, or at least two times greater, or at least three times greater, or at least five times greater). In this configuration, the second portion of the driving voltage dropping across the voltage control element may be greater than the first portion of the driving voltage provided at the switching element.

In some embodiments, the driving element is configured to provide a driving voltage at the voltage supply node less than twice the maximum allowable input voltage, the second capacitance may be greater than the input capacitance (e.g., the second capacitance may be at least 1.5 times greater than the input capacitance, or at least two times greater, or at least three times greater, or at least five times greater). In this configuration, the second portion of the driving voltage dropping across the voltage control element may be less than the first portion of the driving voltage provided at the switching element.

In Example 3, the subject-matter of example 1 or 2 may optionally further include that the voltage control element is configured such that the second capacitance is fully charged in case the first portion of the driving voltage provided at the input of the switching element is substantially equal to the maximum allowable input voltage of the switching element.

In Example 4, the subject-matter of any one of examples 1 to 3 may optionally further include that a ratio of the input capacitance to the second capacitance is proportional (in some embodiments, approximately equal) to a ratio of the driving voltage provided by the driving element at the voltage supply node to the maximum allowable input voltage of the switching element. In some embodiments, a ratio of the input capacitance to the second capacitance may be approximately equal to a ratio of a difference between the driving voltage provided by the driving element at the voltage supply node and the maximum allowable input voltage of the switching element to the maximum allowable input voltage of the switching element.

In Example 5, the subject-matter of any one of examples 1 to 4 may optionally further include that the driving element is configured to provide a driving voltage at the supply node at least 1.5 times greater than the maximum allowable input voltage of the switching element. In some embodiments, the driving voltage may be at least two times greater than the maximum allowable input voltage, or at least three times greater than the maximum allowable input voltage, or at least five times greater than the maximum allowable input voltage.

In Example 6, the subject-matter of any one of examples 1 to 5 may optionally further include that the input of the switching element and the voltage control element are coupled in series with one another.

In Example 7, the subject-matter of any one of examples 1 to 6 may optionally further include that an absolute value of the driving voltage is in the range from 5 V to 25 V. In some embodiments, the absolute value of the driving voltage may be in the range from 10 V to 20 V. In some embodiments, the absolute value of the driving voltage may be greater than 5 V, or greater than 10 V, or greater than 12 V, or greater than 15 V.

In Example 8, the subject-matter of any one of examples 1 to 7 may optionally further include that an absolute value of the maximum allowable input voltage is equal to or less than 6 V. In some embodiments, the absolute value of the maximum allowable input voltage may be in the range from 2 V to 15 V, for example in the range from 4 V to 8 V. In some embodiments, the absolute value of the maximum allowable input voltage may be equal to or less than 10 V, for example less than 8 V.

In Example 9, the subject-matter of any one of examples 1 to 8 may optionally further include that the switching element includes a second control node, a third control node, and a first control node to control an electrical behaviour of the second control node and the third control node.

In some embodiments, the voltage control element may be coupled with the first control node of the switching element.

In Example 10, the subject-matter of example 9 may optionally further include that the input capacitance is a capacitance associated with the first control node of the switching element.

In Example 11, the subject-matter of example 9 or 10 may optionally further include that one of the second control node or the third control node of the switching element is coupled with the light source and with the driving element.

In Example 12, the subject-matter of any one of examples 9 to 11 may optionally further include that the switching element is configured, in a first state, to prevent a current flow between the second control node and the third control node, that the switching element is configured, in a second state, to allow a current flow between the second control node and the third control node, and that the switching element is configured to switch from the first state into the second state in accordance with the charging of the input capacitance.

In Example 13, the subject-matter of any one of examples 1 to 12 may optionally further include that the switching element includes a semiconductor transistor.

In Example 14, the subject-matter of example 13 may optionally further include that the semiconductor transistor includes at least one of a field-effect transistor or an insulated gate bipolar transistor.

In Example 15, the subject-matter of example 14 may optionally further include that the field-effect transistor includes at least one of a metal oxide semiconductor field effect transistor or a gallium nitride field effect transistor.

In Example 16, the subject-matter of example 13 to 15 may optionally further include that the driving element is configured to provide a driving voltage at the supply node greater than a threshold voltage of the semiconductor transistor. By way of example, the driving voltage may be at least 1.5 times greater than the threshold voltage of the semiconductor transistor, for example at least two times greater than the threshold voltage of the semiconductor transistor, for example at least five times greater than the threshold voltage of the semiconductor transistor, for example at least ten times greater than the threshold voltage of the semiconductor transistor.

In Example 17, the subject-matter of example 9 and any one of examples 13 to 16 may optionally further include that the first control node is a gate node, and that the input capacitance of the switching element is a gate capacitance of the semiconductor transistor.

In Example 18, the subject-matter of example 9 and any one of examples 13 to 17 may optionally further include that the second control node is one of a source/drain node of the field effect transistor and that the third control node is another one of a source/drain node of the semiconductor transistor.

In Example 19, the subject-matter of example 18 may optionally further include that the input capacitance of the switching element is a gate capacitance of the field-effect transistor, the gate capacitance being a combination of a gate-source capacitance and a gate-drain capacitance of the semiconductor transistor.

In Example 20, the subject-matter of example 18 or 19 may optionally further include that the maximum allowable input voltage of the switching element is a maximum allowable gate-source voltage of the semiconductor transistor.

In Example 21, the subject-matter of example 2 and any one of examples 18 to 20 may optionally further include that the first portion of the driving voltage provided at the input of the switching element is a gate-source voltage of the semiconductor transistor.

In Example 22, the subject-matter of any one of examples 1 to 21 may optionally further include that the voltage control element includes a capacitor, and that the second capacitance associated with the voltage control element is or includes a capacitance of the capacitor.

In Example 23, the subject-matter of example 22 may optionally further include that the second capacitance is in the range from about 0.5 nF to about 5 nF.

In Example 24, the subject-matter of example 22 or 23 may optionally further include that the voltage control element further includes a resistive element configured to provide a discharging path for the input capacitance of the switching element.

In Example 25, the subject-matter of example 24 may optionally further include that the resistive element and the capacitor are coupled in parallel with one another.

In Example 26, the subject-matter of example 24 or 25 may optionally further include that the resistive element includes a diode or a resistor.

In Example 27, the subject-matter of any one of examples 1 to 27 may optionally further include that the light source includes one or more light emitting diodes.

In Example 28, the subject-matter of example 27 may optionally further include that the one or more light emitting diodes are coupled in parallel with one another.

In Example 29, the subject-matter of example 27 or 28 may optionally further include that the light source includes one or more laser diodes.

In Example 30, the subject-matter of any one of examples 1 to 29 may optionally further include that the light emitting device further includes a charge storage element, and that the switching element is configured to control a current flow to the light source by controlling a discharge of the charge storage element.

In Example 31, the subject-matter of example 30 may optionally further include that the light source is configured to emit a light pulse upon receiving a current pulse provided by the discharging of the charge storage element.

In Example 32, the subject-matter of example 30 or 31 may optionally further include that the charge storage element includes a capacitor.

In Example 33, the subject-matter of any one of examples 1 to 32 may optionally further include that the driving element includes a high-side driver.

In Example 34, the subject-matter of any one of examples 1 to 33 may optionally further include that the driving element is coupled to a first voltage supply and to a second voltage supply, the first voltage supply configured to provide a first supply voltage for a logic operation of the driving element, the second voltage supply configured to provide a second supply voltage for providing the driving voltage.

In Example 35, the subject-matter of example 34 may optionally further include that the first supply voltage is less than the second supply voltage.

In Example 36, the subject-matter of example 34 or 35 may optionally further include that the first supply voltage is in the range from about 2 V to about 6 V, and the second supply voltage is in the range from about 5 V to about 25 V.

In Example 37, the subject-matter of any one of examples 1 to 36 may optionally further include that the light source includes a plurality of light sources, and that the switching element is configured to control a current flow to each light source of the plurality of light sources.

In Example 38, the subject-matter of any one of examples 1 to 36 may optionally further include that the light source includes a plurality of light sources, that the switching element includes a plurality of switching elements, each assigned to respective one or more light sources of the plurality of light sources, and that the voltage control element includes a plurality of voltage control elements, each assigned to a respective switching element of the plurality of switching elements.

In Example 39, the subject-matter of example 38 may optionally further include that the driving element includes a plurality of driving elements, each assigned to respective one or more switching elements of the plurality of switching elements.

Example 40 is a LIDAR system including one or more light emitting devices according to any one of examples 1 to 39.

Example 41 is a light emitting device including: a light source; a switching element including an input node, the switching element being configured to control a current flow to the light source in accordance with an input voltage provided at the input node; a voltage control element coupled with a voltage supply node and with the input node; and a driving element configured to provide a driving voltage at the voltage supply node, the driving voltage being greater than a maximum allowable input voltage of the switching element, wherein the voltage control element and the input node are coupled to one another in such a way that a first portion of the driving voltage is provided at the input node as input voltage and a second portion of the driving voltage drops across the voltage control element, wherein a relationship between the first portion and the second portion is in accordance with a relationship between the driving voltage and the maximum allowable input voltage.

Example 42 is a light emitting device including: a light source; a semiconductor transistor having a gate capacitance associated therewith, the semiconductor transistor being configured to control a current flow to the light source in accordance with a charging of the gate capacitance; a passive network coupled with the semiconductor transistor and with a voltage supply node, wherein the passive network and the semiconductor transistor are coupled to one another to form a capacitive voltage divider, wherein the passive network includes a capacitor having a second capacitance; and a high-side driver configured to provide a driving voltage at the voltage supply node, the driving voltage being greater than a maximum allowable gate-source voltage of the semiconductor transistor, wherein a relationship between the gate capacitance and the second capacitance is in accordance with a relationship between the driving voltage and the maximum allowable gate-source voltage.

In Example 43, the subject-matter of example 42 may optionally further include that the passive network and the semiconductor transistor are coupled to one another in such a way that a first portion of the driving voltage drops across the semiconductor transistor as gate source voltage, and a second portion of the driving voltage drops across the passive network, and that a relationship between the first portion and the second portion is in accordance with the relationship between the driving voltage and the maximum allowable gate-source voltage (e.g., in accordance with the relationship between the gate capacitance and the second capacitance).

Example 44 is a driving arrangement for driving a light source, the driving arrangement including: a switching element including a second control node, a third control node, and a first control node to control an electrical behaviour of the second control node and the third control node; a voltage control element coupled with a voltage supply node and with the switching element at the first control node, wherein the voltage control element and the switching element are coupled to one another in such a way that the voltage control element and the switching element form a capacitive voltage divider; and a driving element configured to provide a driving voltage at the voltage supply node, the driving voltage being greater than a maximum allowable input voltage of the switching element, and wherein a relationship between a capacitance associated with the voltage control element and a capacitance associated with the switching element is in accordance with a relationship between the driving voltage and the maximum allowable input voltage.

While various implementations have been particularly shown and described with reference to specific embodiments, it should be understood by those skilled in the art that various changes in form and detail may be made therein without departing from the spirit and scope as defined by the appended claims. The scope is thus indicated by the appended claims and all changes which come within the meaning and range of equivalency of the claims are therefore intended to be embraced.

The invention claimed is:

1. A light emitting device comprising:
   a light source;
   a switching element having an input capacitance associated therewith, the switching element being configured to control a current flow to the light source in accordance with a charging of the input capacitance;
   a voltage control element coupled with the switching element and having a voltage supply node, the voltage control element having a second capacitance associated therewith,
   wherein the voltage control element and an input of the switching element are coupled to one another such that the voltage control element and the input of the switching element form a capacitive voltage divider; and
   a driving element configured to provide a driving voltage at the voltage supply node, the driving voltage being greater than a maximum allowable input voltage of the switching element, wherein a relationship between the input capacitance and the second capacitance is in accordance with a relationship between the driving voltage and the maximum allowable input voltage.

2. The light emitting device according to claim 1, wherein the input of the switching element and the voltage control element are coupled to one another such that a first portion of the driving voltage is provided at the input of the switching element, and a second portion of the driving voltage drops across the voltage control element, and wherein a relationship between the first portion and the second portion is in accordance with the relationship between the input capacitance and the second capacitance.

3. The light emitting device according to claim 1, wherein a ratio of the input capacitance to the second capacitance is proportional to a ratio of the driving voltage provided by the driving element at the voltage supply node to the maximum allowable input voltage of the switching element.

4. The light emitting device according to claim 1, wherein the driving element is configured to provide the driving voltage at the voltage supply node at least 1.5 times greater than the maximum allowable input voltage of the switching element.

5. The light emitting device according to claim 1, wherein an absolute value of the driving voltage is in a range from 5 V to 25 V.

6. The light emitting device according to claim 1, wherein the switching element comprises a semiconductor transistor.

7. The light emitting device according to claim 6, wherein the input of the switching element is a gate node, and wherein the input capacitance of the switching element is a gate capacitance of the semiconductor transistor.

8. The light emitting device according to claim 6, wherein the maximum allowable input voltage of the switching element is a maximum allowable gate-source voltage of the semiconductor transistor.

9. The light emitting device according to claim 1, wherein the voltage control element comprises a capacitor, and wherein the second capacitance associated with the voltage control element comprises a capacitance of the capacitor.

10. The light emitting device according to claim 9, wherein the second capacitance is in a range from about 0.5 nF to about 5 nF.

11. The light emitting device according to claim 9, wherein the voltage control element further comprises a resistive element configured to provide a discharging path for the input capacitance of the switching element.

12. The light emitting device according to claim 1, wherein the driving element is coupled to a first voltage supply and to a second voltage supply, the first voltage supply being configured to provide a first supply voltage for a logic operation of the driving element and the second voltage supply being configured to provide a second supply voltage for providing the driving voltage.

13. The light emitting device according to claim 12, wherein the first supply voltage is in a range from about 2 V to about 6 V, and the second supply voltage is in a range from about 5 V to about 25 V.

14. A Light Detection and Ranging (LIDAR) system comprising:
one or more light emitting devices according to claim 1.

15. A driving arrangement for driving a light source, the driving arrangement comprising:
a switching element comprising a second control node, a third control node, and a first control node to control an electrical behavior of the second control node and the third control node;
a voltage control element coupled with a voltage supply node and with the switching element at the first control node,
wherein the voltage control element and the switching element are coupled to one another such that the voltage control element and the switching element form a capacitive voltage divider; and
a driving element configured to provide a driving voltage at the voltage supply node, the driving voltage being greater than a maximum allowable input voltage of the switching element,
wherein a relationship between a capacitance associated with the voltage control element and a capacitance associated with the switching element is in accordance with a relationship between the driving voltage and the maximum allowable input voltage.

* * * * *